US010156613B2

(12) United States Patent
Honda et al.

(10) Patent No.: US 10,156,613 B2
(45) Date of Patent: Dec. 18, 2018

(54) VOLTAGE DETECTION DEVICE

(71) Applicant: DENSO CORPORATION, Kariya, Aichi-pref (JP)

(72) Inventors: Kazutaka Honda, Kariya (JP); Tomohiro Nezuka, Kariya (JP)

(73) Assignee: DENSO CORPORATION, Kariya (JP)

( * ) Notice: Subject to any disclaimer, the term of this patent is extended or adjusted under 35 U.S.C. 154(b) by 304 days.

(21) Appl. No.: 15/278,306

(22) Filed: Sep. 28, 2016

(65) Prior Publication Data

US 2017/0261562 A1 Sep. 14, 2017

(30) Foreign Application Priority Data

Mar. 11, 2016 (JP) .................................. 2016-48343

(51) Int. Cl.
*G01R 31/36* (2006.01)

(52) U.S. Cl.
CPC ..... *G01R 31/3648* (2013.01); *G01R 31/3658* (2013.01)

(58) Field of Classification Search
CPC ........................ G01R 31/3648; G01R 31/3658
USPC .......................................................... 324/434
See application file for complete search history.

(56) References Cited

U.S. PATENT DOCUMENTS 7,289,054 B1 10/2007 Watanabe
2007/0290914 A1 12/2007 Matsushita et al.
2010/0321026 A1 12/2010 Matsuura et al.
2013/0162213 A1 6/2013 Izawa
2015/0200682 A1 7/2015 Nezuka
2015/0381200 A1 12/2015 Goto et al.

FOREIGN PATENT DOCUMENTS

JP 2011-066626 A 3/2011
JP 2012-058135 A 3/2012
JP 2013-024800 A 2/2013

*Primary Examiner* — Melissa Koval
*Assistant Examiner* — Rahul Maini
(74) *Attorney, Agent, or Firm* — Posz Law Group, PLC

(57) ABSTRACT

An A/D conversion device acquires an inter-terminal signal of one or more battery cells when detecting a voltage across the battery cells. The A/D conversion device acquires a failure diagnosis signal during a failure diagnosis. A control unit causes the A/D conversion device to perform A/D conversion processing in a ΔΣ mode or a hybrid mode, in which acquiring remaining bits of higher bits after subjecting the higher bits to a ΔΣ type A/D conversion processing, when detecting the inter-terminal signal of the battery cells. The control unit causes the A/D conversion device to perform the A/D conversion processing in a cyclic mode or a hybrid mode, when detecting the failure diagnosis signal during the failure diagnosis.

8 Claims, 27 Drawing Sheets

1
Do
8
DF
7
9
6
ADC
Cont.
4
MUX
5
MUX
11
Sencer
etc.
10
3
3
3
3
2

DIGITAL FILTER
CONTROL UNIT
SWITCH CONTROL SIGNAL
FIRST BLOCK
SECOND BLOCK

OPERATION MODE
ΔΣ MODE
FIRST BLOCK
SECOND BLOCK
QUANTIZATION
CONVERSION OUTPUT
PERIOD
RESET
SAMPLE
HOLD
Vo2
1,#2
T1
T2
T3
T4
T5

FIRST BLOCK ΔΣ SAMPLE
SECOND BLOCK ΔΣ SAMPLE
DIGITAL FILTER
CONTROL UNIT
SWITCH CONTROL SIGNAL
ADC1
ADC2
Do
Qo1
Qo2
Vin
Vo1
Vo2
Tis
Tic
To
S1a
S2a
S14a
S16a
S1b
S2b
S14b
S16b
S20
C1a
C2a
C3a
C1b
C2b
C3b
24a
24b
27a
27b
7
8
9
13
14
15

FIRST BLOCK ΔΣ HOLD
SECOND BLOCK ΔΣ HOLD
DIGITAL FILTER
CONTROL UNIT
ADC1
ADC2
SWITCH CONTROL SIGNAL
Do
Qo1
Qo2
Vo1
Vo2
Vin
Tis
Tic
To
S20
S16a
S16b
S14a
S14b
S5a
S6a
S7a
S5b
S6b
S7b
S3a
C1a
C2a
C3a
C1b
C2b
C3b
24a
24b
25a
25b
27a
27b
VRa
VRb
VT
VM
VB

FIRST BLOCK INPUT SAMPLE
SECOND BLOCK RESET
DIGITAL FILTER
CONTROL UNIT
SWITCH CONTROL SIGNAL
ADC1
ADC2
Do
Qo1
Qo2
Vo2
Vin
Tic
Tis
To
C1a
C2a
C3a
C1b
C2b
C3b
S2a
S4a
S10a
S17a
S2b
S4b
S10b
S18b
S0b
S21
24a
24b
27a
27b
7
8
9
13
14
15

FIRST BLOCK CYCLIC HOLD
SECOND BLOCK CYCLIC SAMPLE
DIGITAL FILTER
CONTROL UNIT
SWITCH CONTROL SIGNAL
ADC1
ADC2
Do
8
7
9
13
14
15
27a
27b
Qo1
Qo2
S20
Vo1
Vo2
To
Tic
Tis
Vin
24a
24b
C1a
C2a
C3a
C1b
C2b
C3b
S2a
S4a
S2b
S4b
S0b
S8b
S15b
S16a
S11a
S12a
S13a
26a
VT
VM
VB
VRa

FIRST BLOCK CYCLIC SAMPLE
SECOND BLOCK CYCLIC HOLD
DIGITAL FILTER
CONTROL UNIT
SWITCH CONTROL SIGNAL
ADC1
ADC2
Do
Qo1
Qo2
Vin
Vo1
Vo2
VRb
VT
VM
VB
Tic
Tis
To
C1a
C2a
C3a
C1b
C2b
C3b
S0a
S2a
S4a
S8a
S15a
S2b
S4b
S11b
S12b
S13b
S16b
S20
24a
24b
26b
27a
27b
7
8
9
13
14
15

OPERATION MODE
ΔΣ TYPE
CYCLIC TYPE
FIRST BLOCK
SECOND BLOCK
QUANTIZATION
CONVERSION OUTPUT
PERIOD
RESET
SAMPLE
HOLD
SAMPLE (RESET)
Vo1
Vo2
1
2
1,#2
T21
T22
T23
T24
T25
T26
T27
T28
T29
T30
T31
T32
T33

106
FIRST BLOCK
SECOND BLOCK
DIGITAL FILTER
CONTROL UNIT
SWITCH CONTROL SIGNAL
ADC1
ADC2
Do
Vin
Vo1
Vo2

FIRST BLOCK INITIAL SAMPLE
SECOND BLOCK INITIAL SAMPLE
DIGITAL FILTER
CONTROL UNIT
SWITCH CONTROL SIGNAL
ADC1
ADC2
Do
Qo1
Qo2
Vo1
Vo2
Vin
Tic
Tis
To
S1a
S2a
S14a
S16a
C1a
C2a
C3a
S1b
S2b
S14b
S16b
C1b
C2b
C3b
24a
24b
27a
27b
7
8
13
109
114
115

FIRST BLOCK INITIAL HOLD
SECOND BLOCK INITIAL HOLD
DIGITAL FILTER
CONTROL UNIT
SWITCH CONTROL SIGNAL
ADC1
ADC2
Do
Vin
Vo1
Vo2
Qo1
Qo2
VM
114
115
109
8
7
13

206
212
214
213
227
ADC1
Qo1
209
CONTROL UNIT
7
DIGITAL FILTER
8
Do
BLOCK
222a
221a
23a
24a
20a
S16a
S18a
C3a
S14a
C2a
26a
S11a
S12a
S13a
S9a
S0a
S3a
S2a
C1a
25a
S5a
S6a
S7a
S1a
S4a
VT
VM
VB
VRa
Tis
Vin
To
Vo 206
212
214
213
227
ADC1
209
CONTROL UNIT
7
DIGITAL FILTER
8
RESET
Do
Qo1
Vo
To
24a
20a
S0a
222a
221a
C3a
C2a
C1a
S15a
S9a
S4a
S2a
Tis
Vin
RESET

206
ΔΣ SAMPLE
DIGITAL FILTER
CONTROL UNIT
ADC1
Do
8
7
209
Qo1
227
213
212
214
Vo
To
24a
23a
20a
222a
221a
S16a
C3a
S14a
C2a
C1a
S2a
S1a
Tis
Vin

INITIAL SAMPLE
206
212
214
213
227
ADC1
Qo1
CONTROL UNIT
209
7
DIGITAL FILTER
8
Do
Vo
To
24a
23a
20a
222a
221a
S16a
C3a
S14a
C2a
C1a
S2a
S1a
Tis
Vin

INITIAL HOLD & INITIAL CYCLIC SAMPLE

VOLTAGE DETECTION DEVICE

CROSS REFERENCE TO RELATED APPLICATION

This application is based on Japanese Patent Application No. 2016-48343 filed on Mar. 11, 2016, the disclosure of which is incorporated herein by reference.

TECHNICAL FIELD

The present disclosure relates to a voltage detection device for detecting a charging voltage of an electric object such as an assembled battery.

BACKGROUND

In general, a voltage detection device performs detection, for example, with the use of an A/D conversion device for complicated signal processing or an interface with a microprocessor. The use of the A/D conversion device in a multi-mode where, for example, a ΔΣ system and a pipeline system are combined together has been proposed (for example, refer to Patent Document 1). In addition, the present applicant has proposed a technique used in a hybrid mode where the ΔΣ system and a cyclic system are combined together (for example, refer to Patent Document 2).

(Patent Document 1)

Publication of Unexamined Japanese Patent Application No. 2011-66626

(Patent Document 2)

Publication of Unexamined Japanese Patent Application No. 2015-133626

It is conceivable to apply such an A/D conversion device to a detection process for a charging voltage across battery cells in an assembled battery and to a voltage detection process during a failure diagnosis. It is conceivable to enhance a voltage detection accuracy in order to improve a monitoring of a charging state of the battery cell or to improve a calculation performance of the charging amount. In this case, an A/D conversion processing is performed with a high voltage detection accuracy even when the A/D conversion device is used for the voltage detection process during the failure diagnosis.

From the viewpoint of safety of the system, when a failure in more circuit blocks is diagnosed, it takes much processing time related to the failure diagnosis, and a diagnosis schedule becomes overcrowded. As a result, the entire diagnosis process cannot be completed within a predetermined period. In addition, the safety of the system may be likely to be impaired. For that reason, the safety of the system is required to be ensured while the voltage detection accuracy of the battery cell is improved. In addition to such a case, there is a need to adapt the detection accuracy and the processing time to various states, and the detection accuracy and the processing time are required to be flexibly changeable according to an object to be detected.

SUMMARY

It is an object of the present disclosure to produce a voltage detection device that is capable of flexibly and adaptively changing a detection accuracy and a processing time of an A/D conversion device according to a change in an object to be detected.

According to an aspect of the present disclosure, a voltage detection device is for detecting a voltage across a plurality of battery cells forming an assembled battery. The voltage detection device comprises an A/D conversion device configured to acquire an inter-terminal signal of one or more battery cells in the plurality of battery cells, when detecting a voltage across the battery cells, and to acquire a failure diagnosis signal during a failure diagnosis. The A/D conversion device is configured to subject the inter-terminal signal and the failure diagnosis signal as acquired to an A/D conversion. The A/D conversion device is configured to perform ΔΣ type A/D conversion processing in a ΔΣ mode, to perform cyclic type A/D conversion processing in a cyclic mode, and to perform, in a hybrid mode, the cyclic type A/D conversion processing when acquiring remaining bits of higher bits after subjecting the higher bits to the ΔΣ type A/D conversion processing. The voltage detection device further comprises a control unit configured to control the A/D conversion device to switch the ΔΣ mode, the cyclic mode, and the hybrid mode. The control unit is configured to cause the A/D conversion device to perform the A/D conversion processing in the ΔΣ mode or in the hybrid mode, when detecting the inter-terminal signal of the battery cells. The control unit is configured to cause the A/D conversion device to perform the A/D conversion processing in the cyclic mode or in the hybrid mode, when detecting the failure diagnosis signal during the failure diagnosis.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION

Figure 1:
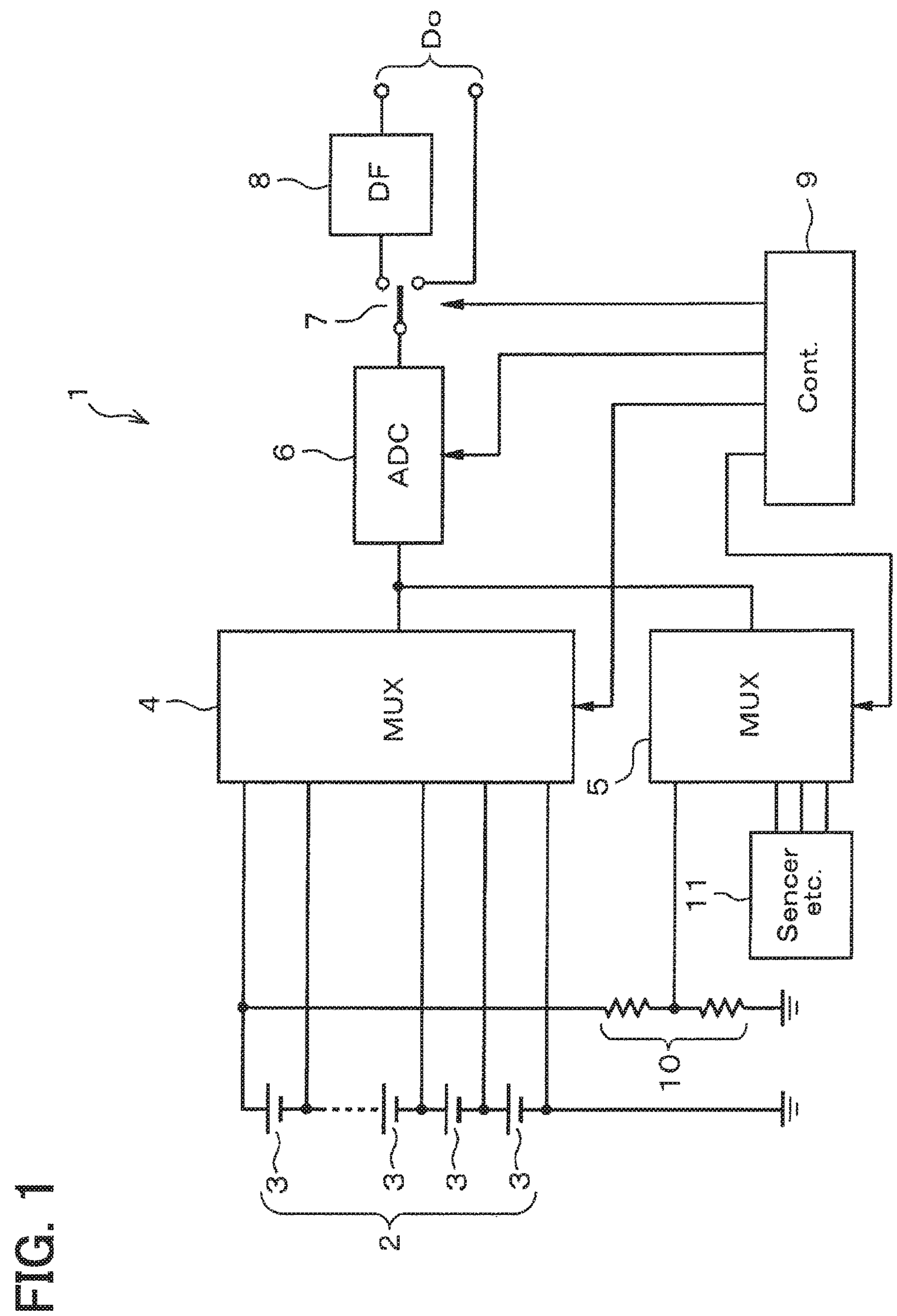
FIG. 1 is a diagram schematically illustrating a system configuration according to a first embodiment.

Hereinafter, multiple embodiments of a voltage detection device will be described with reference to the accompanying drawings. In the respective embodiments described below, configurations that perform the same or similar operation are denoted by the same or similar reference numerals, and their description will be omitted as occasion demands. In the following embodiments, the same or similar configurations are denoted by the same reference numerals with tens digit and ones digit as well as a suffix for description.

First Embodiment

FIGS. 1 to 13 show illustrative views of a first embodiment. FIG. 1 schematically illustrates an electric configuration example of a voltage detection device mounted on a vehicle. A voltage detection device 1 monitors a state of an inter-terminal voltage across each of battery cells 3 configuring an assembled battery 2 and a failure of elements configuring the voltage detection device 1. The assembled battery 2 is mounted as a power supply for a travel motor of an electric vehicle, and configured to connect the multiple battery cells 3 each formed of a lithium ion secondary battery in series.

The voltage detection device 1 includes one or more multiplexers 4, 5, a hybrid A/D conversion device (hereinafter referred to as “A/D conversion device”) 6, a switch 7, a digital filter 8, and a control unit 9, and the voltage detection device 1 is connected to the other peripheral circuits 10 and 11. The multiplexer 4 receives the respective terminal voltages of the multiple battery cells 3 connected in series, and switchingly outputs those input voltages to the A/D conversion device 6 on the basis of a control signal from the control unit 9. The multiplexer 5 receives voltages output from the peripheral circuits 10 and 11, and switchingly outputs those input voltages to the A/D conversion device 6 on the basis of the control signal from the control unit 9. The peripheral circuit 10 is configured by a voltage divider circuit that divides a total voltage of the assembled battery 2, and receives a divided voltage of the total voltage across the assembled battery 2 as a block voltage. The peripheral circuit 11 includes a temperature sensor, an in-C power supply, and a block that receives an external signal, and switchingly outputs those input signals to the A/D conversion device 6. The peripheral circuits 10 and 11 are not limited to the configurations described above.

The multiplexer 5 receives the divided voltage of the total voltage as a block voltage through another path different from voltage input paths of the multiplexer 4. The multiplexer 5 compares the total of the inter-terminal voltages of the respective battery cells 3 selectively output through the multiplexer 4 with the block voltage output by the peripheral circuit 10, and the control unit 9 determines whether a leak failure is present in the detection paths of the battery cells 3, or not.

The A/D conversion device 6 subjects the voltage switchingly input as described above to A/D conversion processing. The A/D conversion device 6 is configured to be operable in a ΔΣmode for processing a ΔΣ type A/D conversion, in a cyclic mode for processing a cyclic type A/D conversion, and in a hybrid mode for processing a cyclic type A/D conversion when acquiring the remaining bits of higher bits after subjecting the higher bits to the ΔΣ type A/D conversion processing. The control unit 9 switchingly controls those modes. The detailed operation of those modes will be described later.

The switch 7 is configured to be switchable according to the control signal from the control unit 9. When the control unit 9 operates the A/D conversion device 6 in the ΔΣ mode, the control unit 9 changes over the switch 7 so as to connect the A/D conversion device 6 to the digital filter 8, thereby to set an output of the digital filter 8 as a data output Do. When the control unit 9 operates the A/D conversion device 6 in the cyclic mode or in the hybrid mode, the control unit 9 changes over the switch 7 to set the output of the A/D conversion device 6 as the data output Do as it is, without passing through the digital filter 8. Hereinafter, the configuration of the A/D conversion device 6, and the operation of the ΔΣ mode, the cyclic mode, and the hybrid mode will be described.

In the hybrid mode, a digital integrator is used for processing. The digital integrator is used when the higher bits caused by the ΔΣ type A/D conversion processing and lower bits caused by the cyclic type NC conversion processing are coupled with each other. Although the digital integrator is classified into a digital filter, because the digital integrator has a function required for a process of coupling the higher bits with the lower bits, the digital integrator will be described separately from the above digital filter 8 changeable to an arbitrary filter characteristic.

(Configuration of A/D Conversion Device 6)

Figure 2:
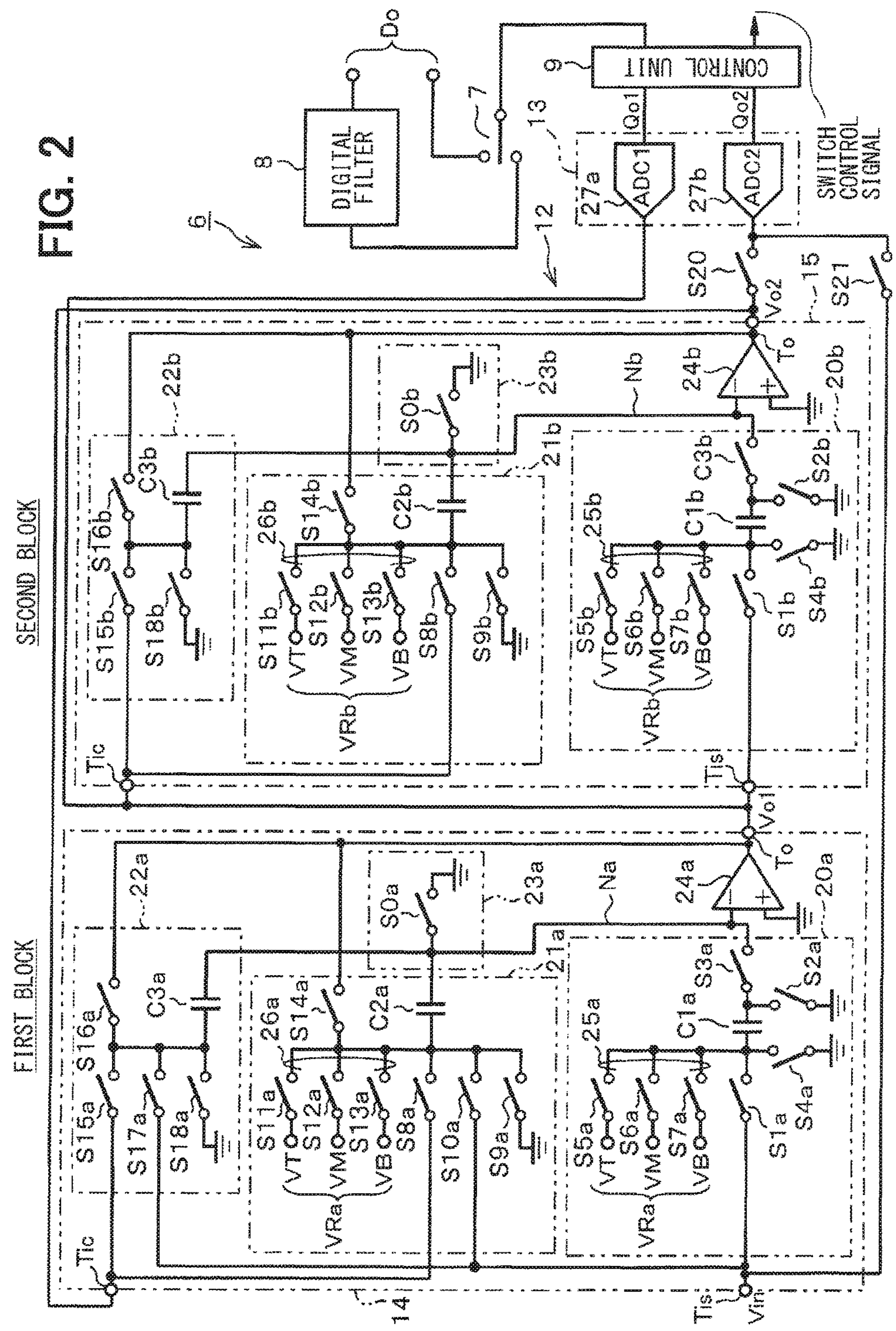
FIG. 2 is an electric configuration diagram of an A/D conversion device.

As illustrated in FIG. 2, the A/D conversion device 6 includes a signal processing unit 12 and a quantization unit 13. The signal processing unit 12 has a secondary configuration including a first block 14 and a second block 15. Because the first block 14 and the second block 15 have the same configuration, the configuration of the first block 14 will be described below. The first block 14 includes two input terminals Tis, Tic, and an output terminal To as circuit input/output terminals.

The input terminal Tis of the first block 14 receives an analog input signal Vin. The first block 14 includes first capacitor switching circuits **20*a*, 21*a*, 22*a*, a ground switch circuit 23*a*, and an arithmetic amplifier 24*a*. A non-inverting input terminal of the arithmetic amplifier 24*a* is connected to an analog ground line having a ground potential. An inverting input terminal of the arithmetic amplifier 24*a* is connected to a common output node Na of the capacitor switching circuits 20*a*, 21*a*, and 22*a*, and also connected to the ground switch circuit 23*a* through the node Na. An output of the arithmetic amplifier 24***a* is connected to an output terminal To of the first block 14. The ground switch circuit 23*a* includes a switch S0*a* interposed between an analog ground line and the node Na.

The capacitor switching circuit 20*a* includes a capacitor C1*a*, switches S1*a* to S4*a*, and a D/A converter 25*a*. The capacitor C1*a* is configured to charge and discharge electric charge according to an on/off switching operation of the switch by the control unit 9. One terminal of the capacitor C1*a* is connected to the node Na through the switch S3*a*, and also connected to the analog ground line through the switch S2*a*. The other terminal of the capacitor C1*a* is connected to the input terminal Tis through the switch S1*a*, and also connected to the analog ground line through the switch S4*a*.

In addition, the other terminal of the capacitor C1*a* is connected to the D/A converter 25*a*. The D/A converter 25*a* includes multiple switches S5*a* to S7*a*. The control unit 9 changes over those switches S5*a* to S7*a* to supply any one of conversion outputs VT, VM, and VB output from the quantization unit 13 to the other terminal of the capacitor C1*a*. The conversion outputs VT, VM, and VB of the quantization unit 13 correspond to analog voltages obtained by subjecting output digital values of the quantization unit 13 to D/A conversion processing, and have, for example, a relationship of VT>VM>VB. Hereinafter, the selected conversion output is referred to as "VRa".

The capacitor switching circuit 21*a* includes a capacitor C2*a*, switches S8*a* to S10*a*, S14*a*, and a D/A converter 26*a*. The capacitor C2*a* is configured to charge and discharge the electric discharge according to the on/off switching operation of the switches S8*a* to S10*a* and S14*a* by the control unit 9, or the driving operation of the D/A converter 26*a*. One terminal of the capacitor C2*a* is connected directly to the node Na. The other terminal of the capacitor C2*a* is connected to the input terminal Tic through the switch S8*a*, and also connected to the analog ground line through the switch S9*a*. The other terminal of the capacitor C2*a* is connected to the input terminal Tis through the switch S10*a*.

The other terminal of the capacitor C2*a* is connected to the D/A converter 26*a*. The D/A converter 26*a* includes multiple switches S11*a* to S13*a*. The control unit 9 changes over those switches S11*a* to S13*a* to supply any one of the conversion outputs VT, VM, and VB of the quantization unit 13 to the other terminal of the capacitor C2*a*. The conversion outputs VT, VM, and VB of the quantization unit 13 correspond to analog voltages obtained by subjecting the output digital values of the quantization unit 13 to the D/A conversion processing as with the D/A converter 25*a*. An output of the D/A converter 26*a* is connected to the output terminal To of the arithmetic amplifier 24*a* in the first block 14 through the switch S14*a*.

The capacitor switching circuit 22*a* includes a capacitor C3*a* and switches S15*a* to S18*a*. The capacitor C3*a* is configured to charge and discharge the electric charge according to the on/off switching operation of the switches S15*a* to S18*a* by the control unit 9. One terminal of the capacitor C3*a* is connected directly to the node Na. The other terminal of the capacitor C3*a* is connected to the input terminal Tic through the switch S15*a*, and also connected to the output terminal To of the first block 14 through the switch S16*a*. The other terminal of the capacitor C3*a* is connected to the input terminal Tis through the switch S17*a*. The other terminal of the capacitor C3*a* is connected to the analog ground line through the switch S18*a*.

The second block 15 has the same configuration as that of the first block 14, and is cascaded to the first block 14. For that reason, the description of the connection relationship will be omitted. The portions having the identical function are denoted by a subscript "a" in the first block 14, and denoted by a subscript "b" instead of the subscript "a" in the second block 15, and their description will be omitted. In the second block 15, switches corresponding to the switches S10*a* and S17*a* are not provided in the capacitor switching circuits 21*b* and 22*b*, respectively. As illustrated in FIG. 2, conversion outputs by the D/A converters 25*b* and 26*b* in the second block 15 are denoted by VRb.

The output terminal To of the first block 14 is connected to the two input terminals Tis ant Tic of the second block 15. The output terminal To of the second block 15 is connected to the input terminal Tic of the first block 14. The quantization unit 13 includes a first A/D converter 27*a* and a second A/D converter 27*b*. The output of the first block 14 is input to the first A/D converter 27*a* of the quantization unit 13. The output of the second block 15 is input to the second A/D converter 27*b* of the quantization unit 13 through a switch S20. Both of those A/D converters 27*a* and 27*b* generate quantization values Qo1 and Qo2 as digital outputs of three levels (1.5 bits). In addition, the input terminal Tis of the first block 14 is input to the second A/D converter 27*b* of the quantization unit 13 through a switch S21.

The first A/D converter 27*a* receives an output voltage Vo1 of the output terminal To in the first block 14, subjects the output voltage Vo1 to the A/D conversion processing, and outputs the converted voltage to the control unit 9. The second A/D converter 27*b* of the quantization unit 13 subjects an output voltage Vo2 of the output terminal To in the second block 15 to the A/D conversion processing and outputs the converted voltage to the control unit 9 when the switch S20 is on. The second A/D converter 27*b* subjects an analog input signal to the A/D conversion processing and outputs the converted signal to the control unit 9 when the switch S21 is on.

The control unit 9 controls the on/off operation of the switches 7, S1*a* to S18*a*, S1*b* to S18*b*, S20, and S21 to operate the signal processing unit 12 and the quantization unit 13 in any one of the ΔΣ mode for performing the ΔΣ type A/D conversion processing, the cyclic mode for performing the cyclic type A/D conversion processing, and the hybrid mode for subjecting the remaining bits to the cyclic type A/D conversion processing after performing the A type A/D conversion processing. The control unit 9 obtains an A/D conversion result on the basis of quantization values Qo1 and Qo2 generated by the quantization unit 13, and obtains the data output Do through the digital filter 8 in the case of the ΔΣ mode. The digital filter 8 is configured to perform low-pass filter processing.

Hereinafter, first, the operation of the first block 14 and the second block 15 in the ΔΣ mode, the cyclic mode, and the hybrid mode will be described. In those respective modes, the first block 14 and the second block 15 perform any operation of "reset operation", "ΔΣ sample operation", "ΔΣ hold operation", "input operation", "cyclic sample operation", and "cyclic hold operation".

(1) ΔΣ Mode

Figure 3:
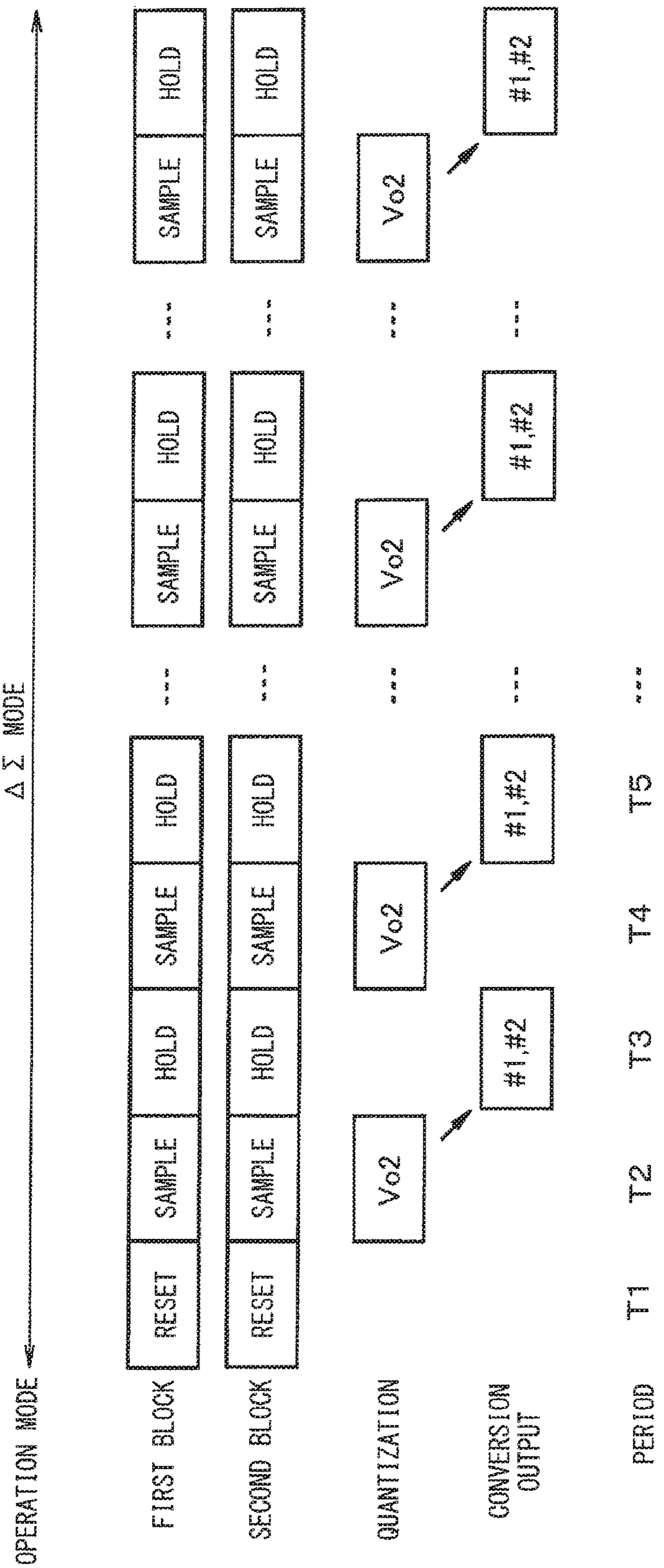
FIG. 3 is a timing chart schematically illustrating a processing procedure in a ΔΣ mode for one cycle.

FIG. 3 illustrates a timing chart of the operation in the ΔΣ mode. In the ΔΣ mode, the A/D conversion device 6 performs so-called oversampling A/D conversion processing. In FIG. 3, unhatched "Reset", "Sample", and "Hold" illustrate respective timings at which the reset operation, the ΔΣ sample operation, and the ΔΣ hold operation are performed. As illustrated in FIG. 3, the first block 14 and the second block 15 concurrently performs the reset operation, the ΔΣ sample operation, and the ΔΣ hold operation. After the first block 14 and second block 15 have performed the reset operation in Step T1, the first block 14 and the second block 15 perform the ΔΣ sample operation in Step T2, and thereafter perform the ΔΣ hold operation in Step T3. Subsequently, as indicated by Steps T4, T5, and so on, the first block 14 and the second block 15 repetitively perform the ΔΣ sample operation and the ΔΣ hold operation. In this state, the quantization unit 13 continues to perform the digital output while oversampling those operation for a predetermined number of times, and the digital filter 8 subjects an output value of the quantization unit 13 to low-pass filtering to obtain the data output Do.

(Reset Operation)

Figure 4:
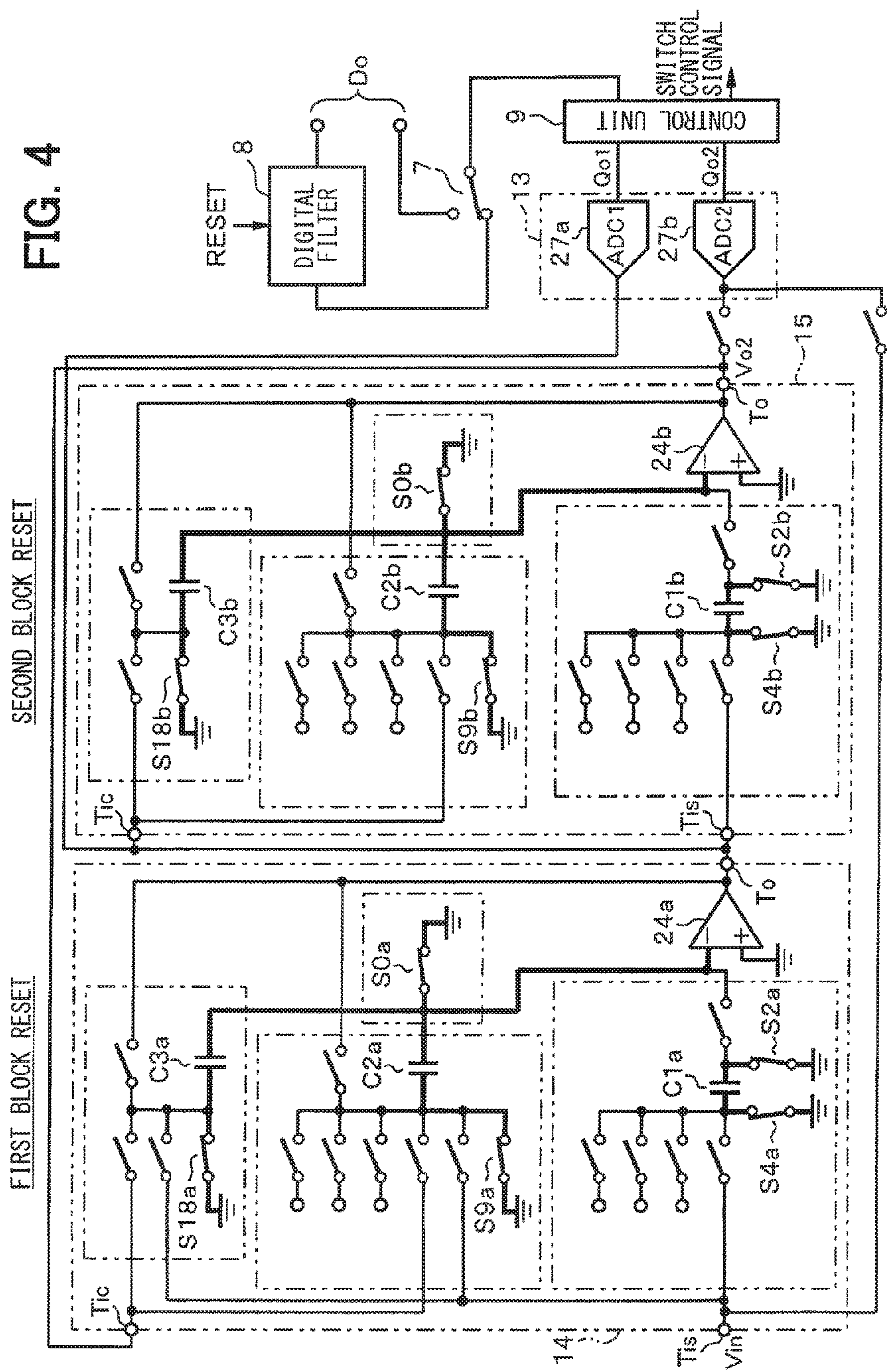
FIG. 4 is an illustrative view schematically illustrating one operation stage in the ΔΣ mode (No. 1)

As illustrated in FIG. 4, in the reset operation of the first block 14, the control unit 9 turns on the switches S0*a*, S2*a*, S4*a*, S9*a*, and S18*a*, and turns off the other switches, thereby performing the operation of discharging the accumulated charge in the capacitors C1*a* to C3*a* to the analog ground line. In the reset operation of the second block 15, the control unit 9 turns on the switches S0*b*, S2*b*, S4*b*, S9*b*, and S18*b*, and turns off the other switches, thereby performing the operation of discharging the accumulated charge in the capacitors C1*b* to C3*b* to the analog ground line. The control unit 9 resets the digital filter 8 before being set to the ΔΣ mode.

(ΔΣ Sample Operation)

Figure 5:
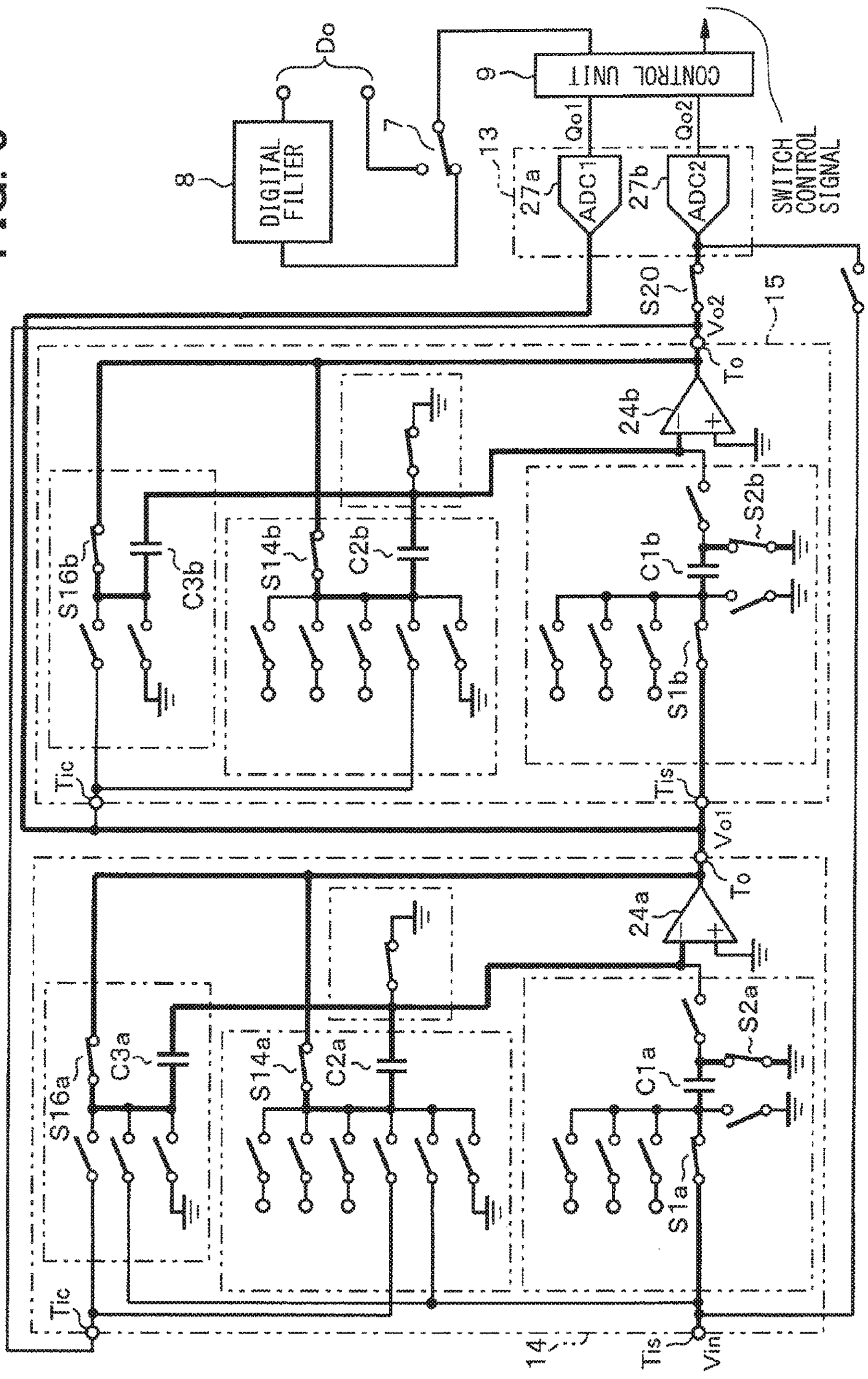
FIG. 5 is an illustrative view schematically illustrating one operation stage in the ΔΣ mode (No. 2)

As illustrated in FIG. 5, in the ΔΣ sample operation of the first block 14, the control unit 9 turns on the switches S1*a*, S2*a*, S14*a*, and S16*a*, and turns off the other switches, thereby to charge the capacitor C1*a* with the analog input signal Vin. Because the switches S14*a* and S16*a* turn on, the capacitors C2*a* and C3*a* are connected in parallel to each other between the inverting input terminal and the output terminal of the arithmetic amplifier 24*a*. As a result, the first block 14 outputs the voltage integrated according to the accumulated charge in the capacitors C2*a* and C3*a* with the use of the arithmetic amplifier 24*a* from the output terminal To.

In the ΔΣ sample operation of the second block 15, the control unit 9 turns on the switches S1*b*, S2*b*, S14*b*, and S16*b*, and turns off the other switches, thereby to input the output voltage Vo1 from the output terminal To of the first block 14 to the other terminal of the capacitor C1*b*. In this state, the capacitor C1*b* is charged with the output voltage Vo1 of the first block 14. On the other hand, the capacitors C2*b* and C3*b* are connected in parallel to each other between the inverting input terminal and the output terminal of the arithmetic amplifier 24*b*. As a result, the second block 15 outputs the voltage integrated according to the accumulated charge in the capacitors C2*b* and C3*b* with the use of the arithmetic amplifier 24*b* from the output terminal To. In this state, the control unit 9 turns on the switch S20 and connects the output terminal To with the second A/D converter 27*b* of the quantization unit 13. As illustrated in FIG. 3, the quantization unit 13 quantizes the voltage through the second A/D converter 27*b* and outputs the quantized voltage to the control unit 9 by bits, and also generates the conversion outputs VRa and VRb used in the subsequent ΔΣ hold operation through the first and second A/D converters 27*a* and 27*b*. In FIG. 3, "#1" and "#2" indicate the first block 14 and the second block 15, respectively.

(ΔΣ Hold Operation)

Figure 6:
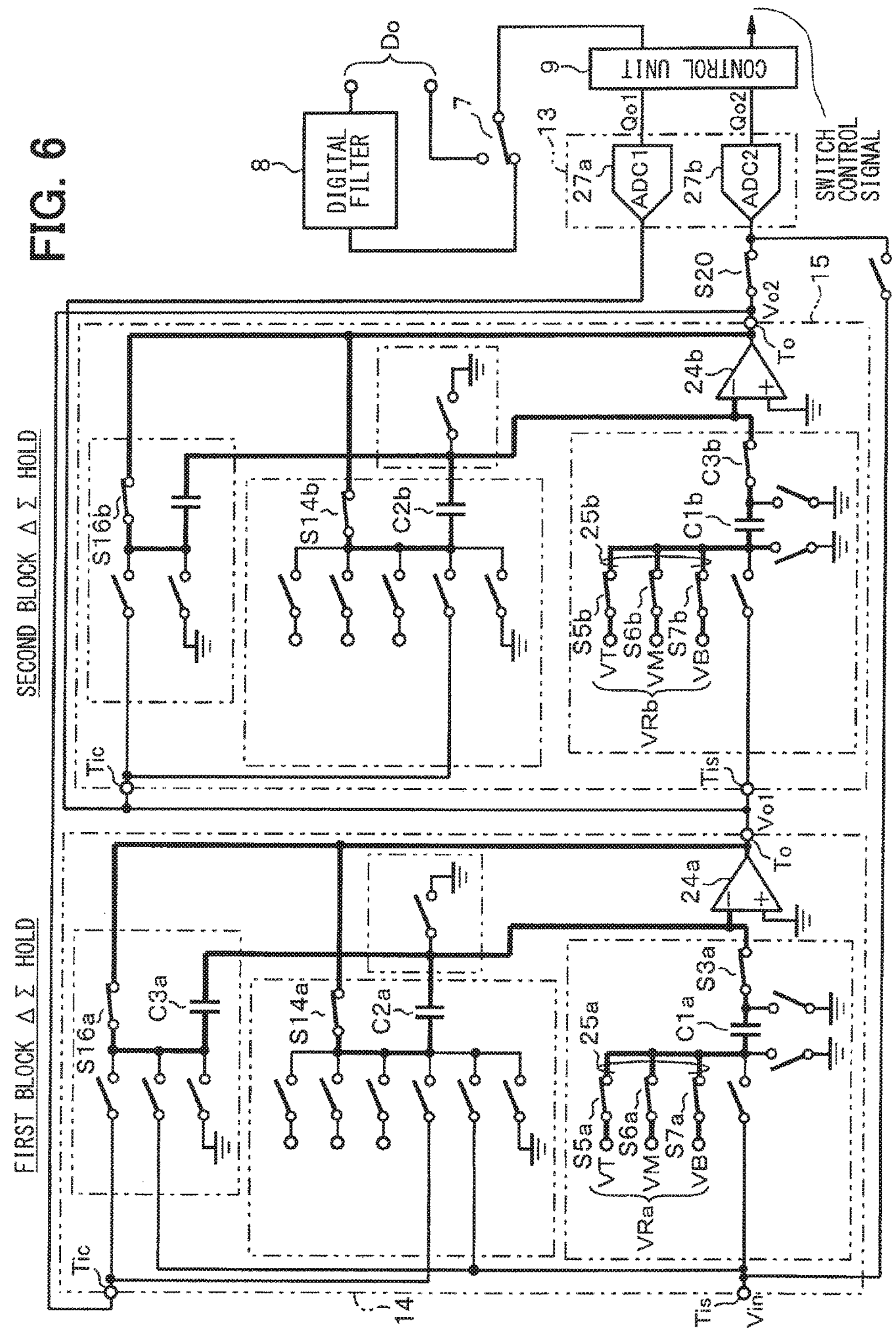
FIG. 6 is an illustrative view schematically illustrating one operation stage in the ΔΣ mode (No. 3)

As illustrated in FIG. 6, in the ΔΣ hold operation of the first block 14, the control unit 9 turns on the switches S3*a*, S14*a*, and S16*a*, and turns off the other switches, thereby to connect one end of the capacitor C1*a* to the inverting input terminal of the arithmetic amplifier 24*a* through the switch S3*a*. In this state, the arithmetic amplifier 24*a* and the capacitors C1*a* to C3*a* configure a charge distribution circuit and an integrator circuit. The residual charge fed back after subtracting the charge corresponding to the conversion output VRa of the D/A converter 25*a* from the charge accumulated in the capacitor C1*a* during the ΔΣ sample operation described above migrates to the capacitors C2*a* and C3*a*. As a result, the residual charge is accumulated in the capacitors C2*a* and C3*a*.

In the ΔΣ hold operation of the second block 15, the control unit 9 turns on the switches S3*b*, S14*b*, and S16*b*, and turns off the other switches. In this state, the arithmetic amplifier 24*b* and the capacitors C1*b* to C3*b* configure the charge distribution circuit and the integrator circuit. The residual charge fed back after subtracting the charge corresponding to the conversion output VRb of the D/A converter 25*b* from the charge accumulated in the capacitor C1*b* during the ΔΣ sample operation described above migrates to the capacitors C2*b* and C3*b*. As a result, the residual charge is accumulated in the capacitors C2*b* and C3*b*.

As illustrated in FIG. 3, after the first block 14 and the second block 15 performs the reset operation concurrently, the first block 14 and second block 15 alternately repetitively execute the ΔΣ sample operation and the ΔΣ hold operation described above concurrently for a predetermined number of time. In the ΔΣ mode, the first and second blocks 14 and 15 become in the same operating state at the same timing.

The quantization unit 13 continues to output a value while the control unit 9 of the A/D conversion device 6 performs those operations by oversampling, and the digital filter 8 subjects the output value of the quantization unit 13 to low-pass filtering to obtain the data output Do. In the ΔΣ mode, the above processing is executed.

(2) Cyclic Mode

Figure 7:
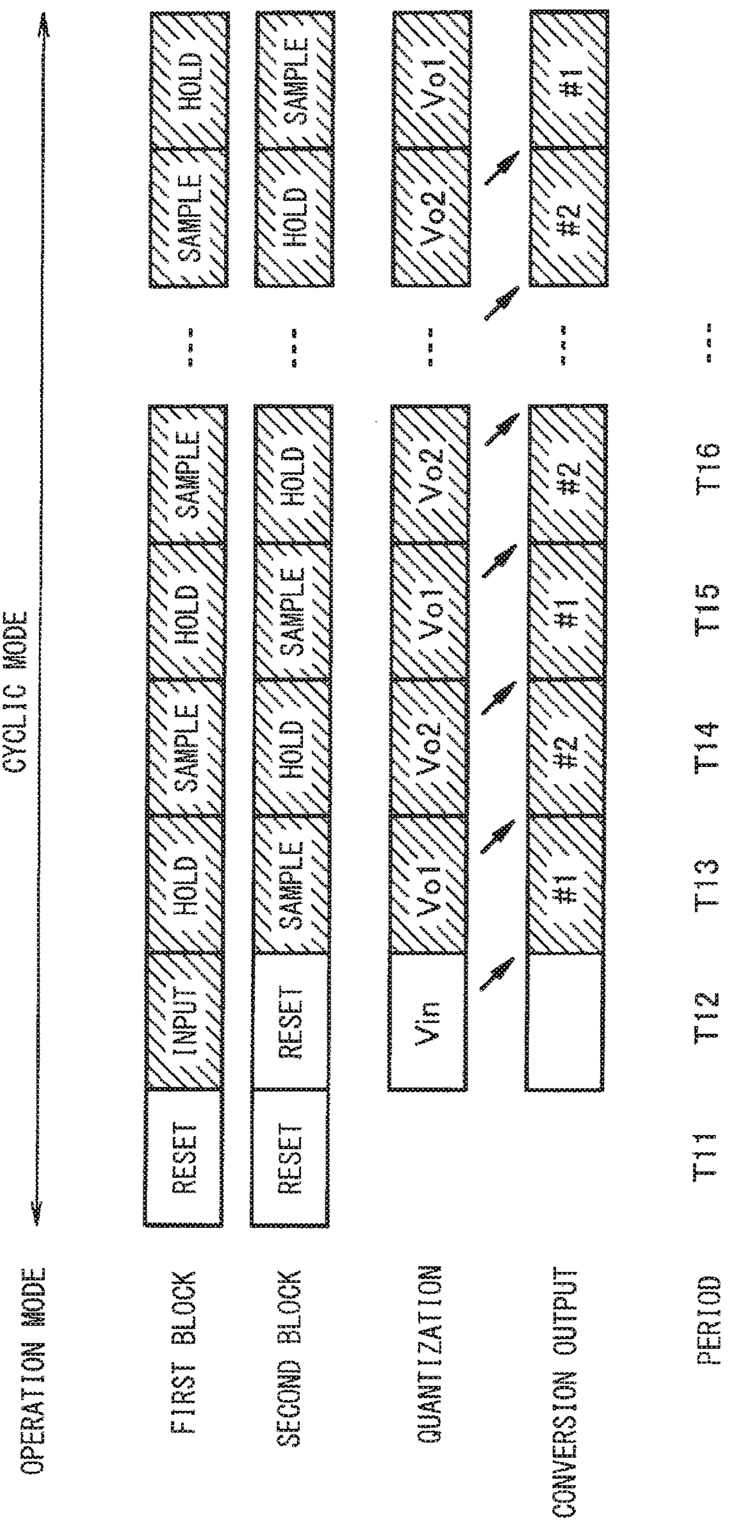
FIG. 7 is a timing chart schematically illustrating a processing procedure in a cyclic mode for one cycle.

FIG. 7 illustrates a timing chart of the operation in the cyclic mode. In FIG. 7, hatched "Input", "Sample", and "Hold" illustrate respective timings at which the input operation, the cyclic sample operation, and the cyclic hold operation are performed. As illustrated in FIG. 7, after the first block 14 and the second block 15 have performed the reset operation at the same time in Step T11, the first block 14 performs the input operation while the second block 15 holds the reset operation in Step T12. Thereafter, the second block 15 performs the cyclic sample operation when the first block 14 performs the cyclic hold operation in Step T13. The first block 14 performs the cyclic sample operation when the second block 15 performs the cyclic hold operation in Step T14. As indicated by Steps T15, T16, and so on, the first block 14 and the second block 15 repetitively perform the processing in Steps T13 and T14.

(Reset Operation of Both Blocks)

The reset operation of the first block 14 and the second block 15 in the cyclic mode is identical with the reset operation of the first block 14 and the second block 15 in the ΔΣ mode illustrated in FIG. 4, and its description will be omitted. Meanwhile, in this example, the control unit 9 disconnects between the output of the quantization unit 13 and the digital filter 8 with the use of the switch 7 and changes over the switch 7 so as to obtain the data output Do as it is, as illustrated in FIG. 8, prior to obtaining the data output Do in the cyclic mode.

(Input Sample Operation of First Block)

Figure 8:
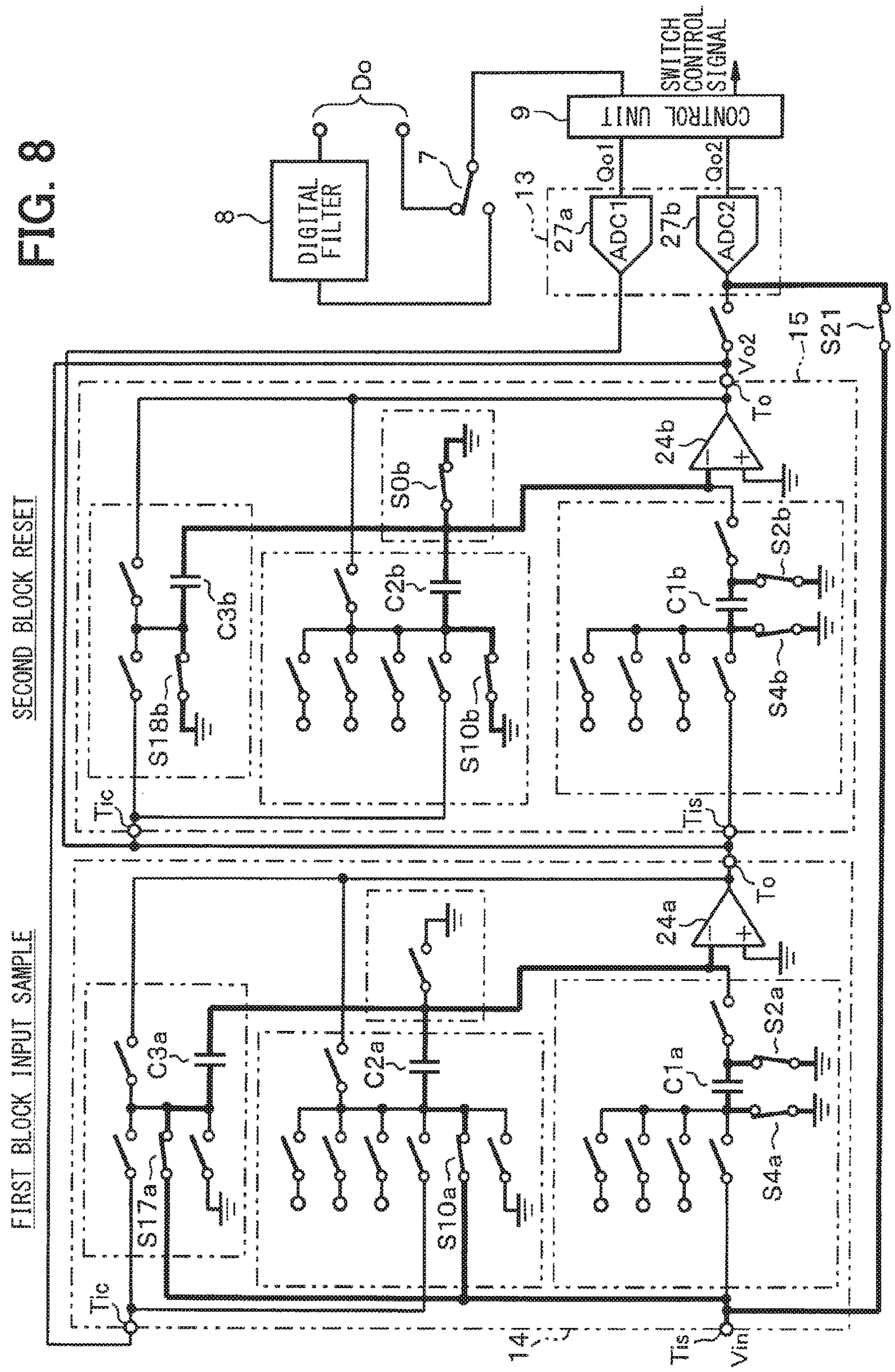
FIG. 8 is an illustrative view schematically illustrating one operation stage in the cyclic mode (No. 1)

As illustrated in FIG. 8, in the input sample operation of the first block 14, the control unit 9 turns on the switches S10*a* and S17*a* and turns off the other switches, thereby to input the analog input signal Vin to the other terminals of the capacitors C2*a* and C3*a*. In this state, the capacitors C2*a* and C3*a* are charged with the analog input signal Vin from the input terminal Tis. The control unit 9 may not turn on the switches S2*a* and S4*a*, but in order to avoid a variation in an inter-terminal voltage of the capacitor C1*a*, it may be reasonable that both of the terminals of the capacitor C1*a* are connected to the analog ground line. In this case, the control unit 9 turns on the switch S21 to input the analog input signal Vin to the second A/D converter 27*b* of the quantization unit 13, and sets the conversion output VRa for performing the subsequent cyclic hold operation of the first block 14 on the basis of the quantization value Qo2 of the second A/D converter 27*b*.

(Cyclic Hold Operation of First Block)

Figure 9:
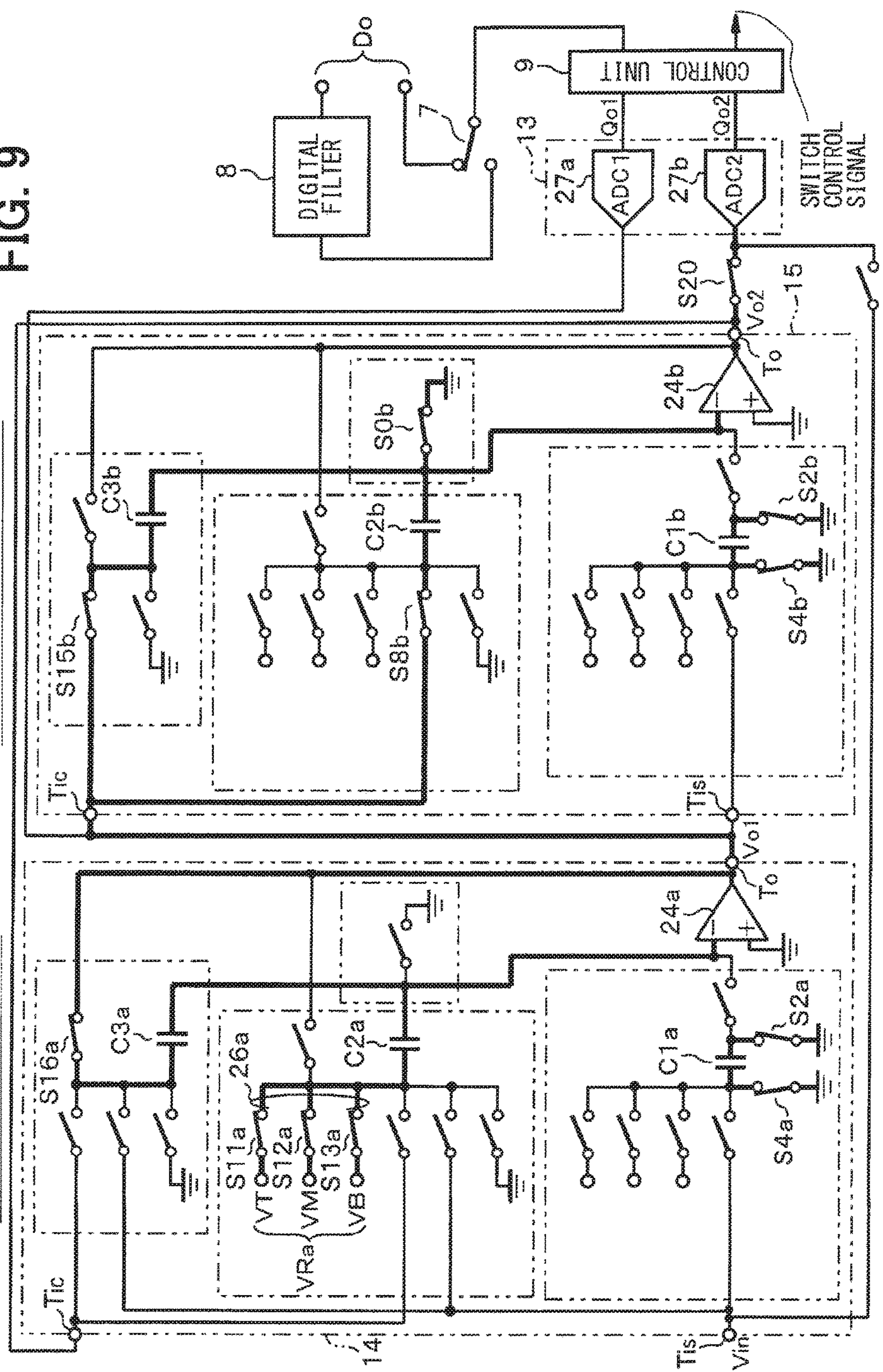
FIG. 9 is an illustrative view schematically illustrating one operation stage in the cyclic mode (No. 2)

As illustrated in FIG. 9, in the cyclic hold operation of the first block 14, the control unit 9 turns on the switches S2*a*, S4*a*, and S16*a*, turns on any one of the switches S11*a*, S12*a*, and S13*a*, and turns off the other switches, thereby to connect both ends of the capacitor C3*a* between the inverting input terminal of the arithmetic amplifier 24*a* and the output terminal. In this state, during the input operation of the first block 14 described above, that is, during the cyclic sample operation of the first block 14 when repeated twice and the subsequent times, the multiplying-DAC (MDAC) processing is performed. In the MDAC processing, the arithmetic amplifier 24*a* subtracts the electric charge corresponding to the conversion output VRa of the D/A converter 26*a* based on the digital output of the quantization unit 13 from the electric charge accumulated in the capacitors C2*a* and C3*a*, and the residual charge is accumulated in the capacitor C3*a*. Subsequently, the output voltage Vo1 subjected to the MDAC processing is output from the output terminal To.

(Cyclic Sample Operation of Second Block)

As illustrated in FIG. 9, in the cyclic sample operation of the second block 15, the control unit 9 turns on the switches S0*b*, S2*b*, S4*b*, S8*b*, and S15*b* and turns off the other switches, thereby to input the output voltage Vo1 from the output terminal To of the first block 14 to the input terminal Tic of the second block 15, to interpose the capacitors C2*b* and C3*b* between the input terminal Tic and the inverting input terminal of the arithmetic amplifier 24*b*, and to connect the inverting input terminal to the analog ground line. As a result, the capacitors C2*b* and C3*b* are charged with the output voltage Vo1 at the output terminal To of the first block 14. The switches S2*b* and S4*b* may not turn on, but in order to avoid a variation in an inter-terminal voltage of the capacitor C1*b*, it may be reasonable that both of the terminals of the capacitor C1*b* are connected to the analog ground line.

(Cyclic Sample Operation of First Block)

Figure 10:
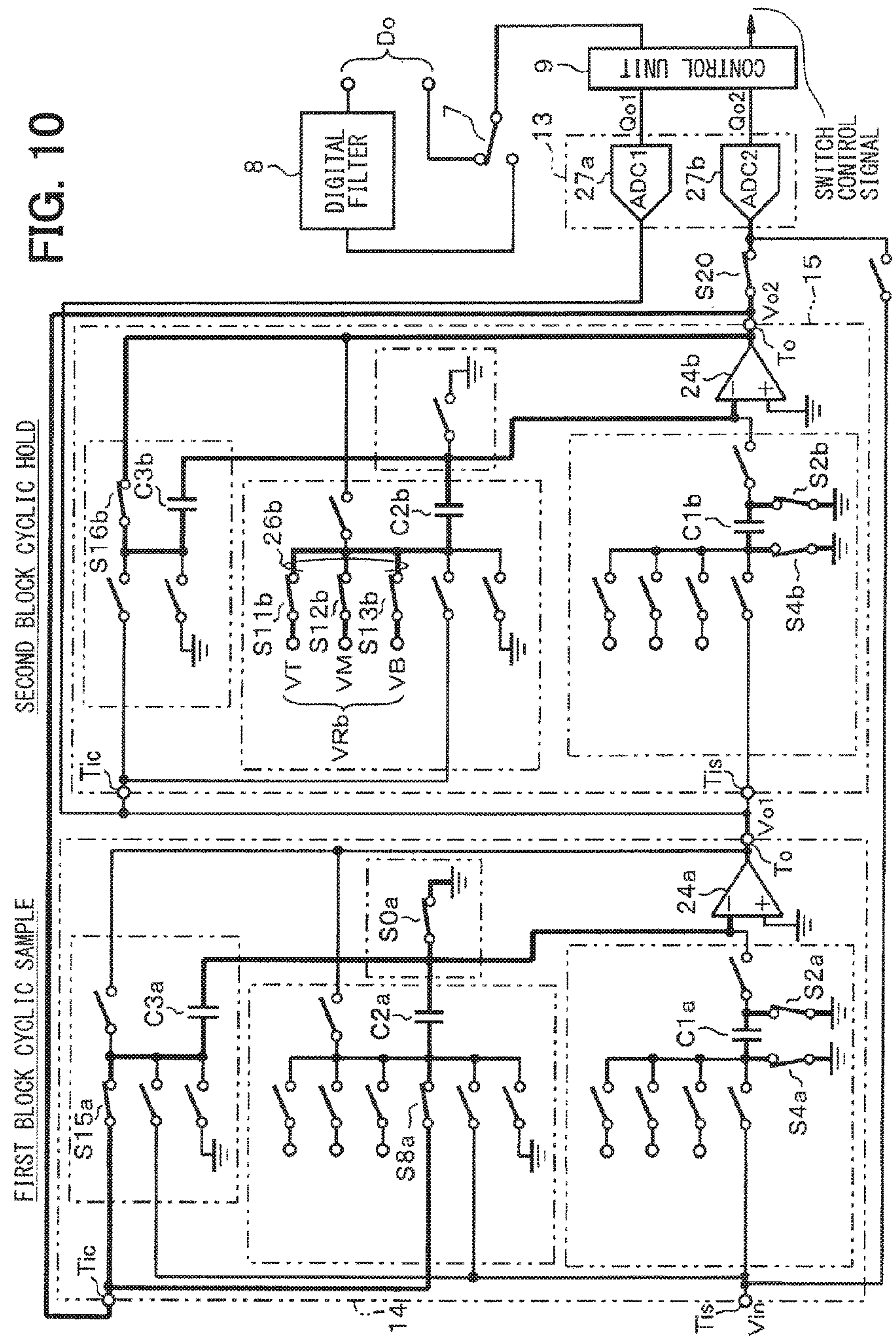
FIG. 10 is an illustrative view schematically illustrating one operation stage in the cyclic mode (No. 3)

As illustrated in FIG. 10, in the cyclic sample operation of the first block 14, the control unit 9 turns on the switches S0*a*, S2*a*, S4*a*, S8*a*, and S15*a* and turns off the other switches, thereby to input the output voltage Vo1 from the output terminal To of the second block 15 to the input terminal Tic of the first block 14, to interpose the capacitor C3*a* between the input terminal Tic and the inverting input terminal of the arithmetic amplifier 24*a*, and to connect the inverting input terminal to the analog ground line. As a result, the capacitors C2*a* and C3*a* are charged with the output voltage Vo1 at the output terminal To of the second block 15. The switches S2*a* and S4*a* may not turn on, but in order to avoid a variation in an inter-terminal voltage of the capacitor C1*a*, both of the terminals of the capacitor C1*a* may be connected to the analog ground line.

(Cyclic Hold Operation of Second Block)

As illustrated in FIG. 10, in the cyclic hold operation of the second block 15, the control unit 9 turns on the switches S2*b*, S4*b*, and S16*b*, turns on any one of the switches S11*b*, S12*b*, and S13*b*, and turns off the other switches, thereby to connect both ends of the capacitor C3*b* to both of the input terminals of the arithmetic amplifier 24*b*, and to input one end of the capacitor C2*b* to the inverting input terminal. In this state, during the cyclic sample operation of the second block 15 described above, the multiplying-DAC (MDAC) processing in which the arithmetic amplifier 24*b* subtracts the electric charge corresponding to the conversion output VRb of the D/A converter 26*b* based on the digital output of the quantization unit 13 from the electric charge accumulated in the capacitors C2*b* and C3*b*, and the residual charge is accumulated in the capacitor C3*b* is performed. Subsequently, the output voltage Vo1 subjected to the MDAC processing is output from the output terminal To.

As illustrated in the timing chart of FIG. 7, after both of the first and second blocks 14 and 15 are reset as illustrated in FIG. 8, the first block 14 receives the analog input signal Vin as illustrated in FIG. 8. Thereafter, as illustrated in FIG. 9, "the cyclic hold operation of the first block 14" and "the cyclic sample operation of the second block 15" are performed. Thereafter, as illustrated in FIG. 10, "the cyclic sample operation of the first block 14" and "the cyclic hold operation of the second block 15" are performed. Thereafter, the operation illustrated in FIG. 9 and the operation illustrated in FIG. 10 are repeated whereby the first and second blocks 14 and 15 of the signal processing unit 12 alternately output the voltage. In other words, the first block 14 and the second block 15 become in the operating states different from each other.

The quantization unit 13 outputs the values Qo1 and Qo2 quantized by the first A/D converter 27*a* and the second A/D converter 27*b* from the most significant bit to the least significant bit to the control unit 9, and the control unit 9 alternately combines those values with each other from values of the higher bits to values of the lower bits to obtain the data output Do. In the cyclic mode, the above processing is executed.

In the condition where the number of quantization bits is the same (for example, 14 bits), in the ΔΣ mode, at least "the ΔΣ sample operation" and "the ΔΣ hold operation" are repeated about several dozen to several thousand times. On the contrary, in the cyclic mode, "the cyclic sample operation" and "the cyclic hold operation" are repeated by the quantization bits to enable the A/D conversion. Therefore, the cyclic mode can complete the A/D conversion processing more quickly.

(3) Hybrid Mode

Figure 11:
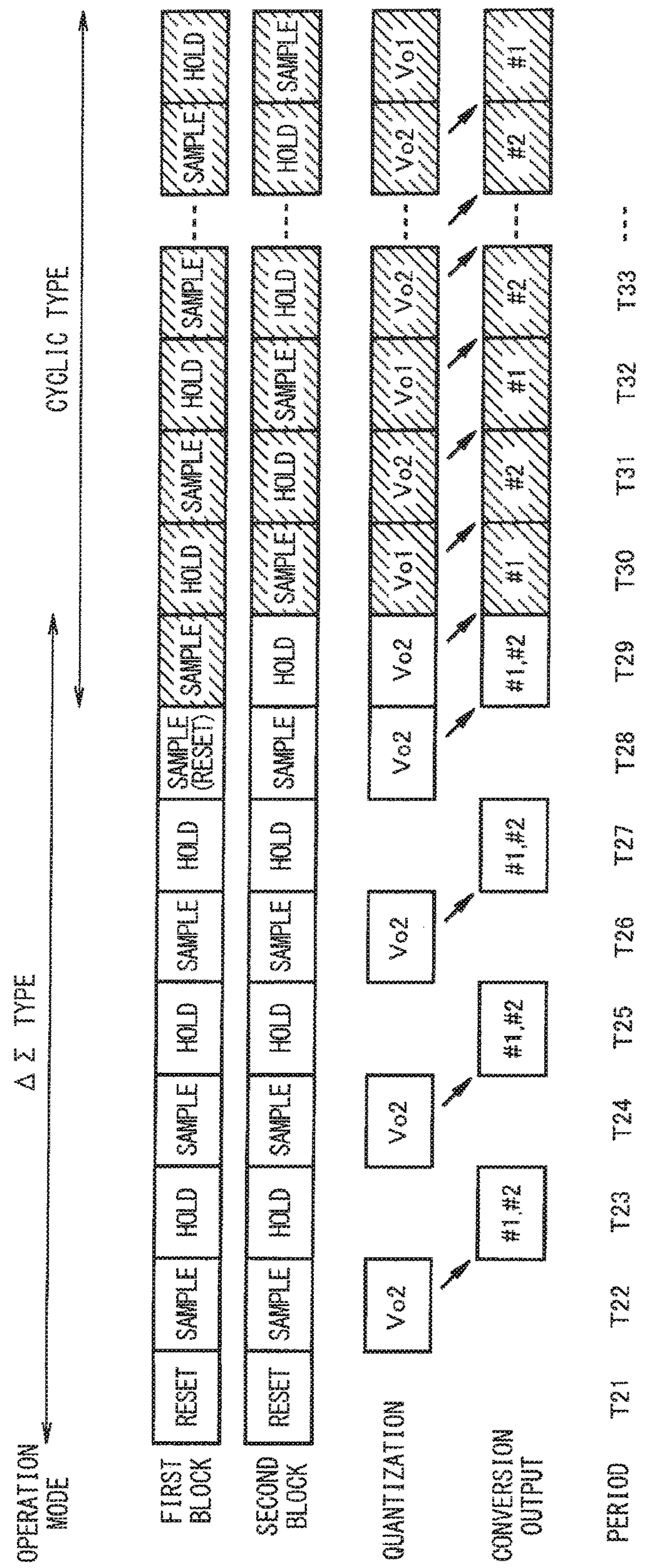
FIG. 11 is a timing chart schematically illustrating a processing procedure in a hybrid mode for one cycle.

FIG. 11 schematically illustrates a timing chart of a processing procedure for outputting the A/D conversion result for one cycle. In FIG. 11, unhatched portions are subjected to the ΔΣ type A/D conversion processing as with the processing in the ΔΣ mode, and hatched portions are subjected to the same cyclic type A/D conversion processing as the processing in the cyclic mode. As illustrated in FIG. 11, in the hybrid mode, the A/D conversion device 6 initially performs the ΔΣ type A/D conversion processing, and thereafter performs the cyclic type A/D conversion processing described above on the residual value of the quantization as an object to be processed. First, after the first block 14 and the second block 15 have been reset at the same time in Step T21, the first block 14 and the second block 15 perform the ΔΣ sample operation at the same time in Step T22, and perform the ΔΣ hold operation at the same time in Step T23. Thereafter, as shown in Steps T24 to T27, a series of the processing is alternately repetitively executed by oversampling processing a predetermined number of times (for example, several tens of times). When the ΔΣ type A/D conversion processing is performed, the first block 14 and the second block 15 become in the same operating state at the same timing as described above.

Thereafter, in Step T28 immediately before shifting to the cyclic type A/D conversion processing, the control unit 9 allows the second block 15 to perform the ΔΣ sample operation, and puts the first block 14 in a reset state. In this state, the control unit 9 turns off the respective switches S14*a* and S16*a* of the second and third capacitor switching circuits 21*a* and 22*a*, and turns on the switches S9*a* and S18*a*. Subsequently, the control unit 9 turns on the switch S0*a* of the ground switch circuit 23*a*, and connects both terminals of the capacitors C2*a* and C3*a* to the analog ground line, thereby to put in the reset state.

Thereafter, in Step T29, the first block 14 starts the processing from the cyclic sample operation in the cyclic mode, and the second block 15 performs the ΔΣ hold operation. The ΔΣ hold operation of the second block 15 is identical with the ΔΣ hold operation. Therefore, in Step T29, the cyclic type A/D conversion processing is performed. In the cyclic sample operation of the first block 14 in Step T29, as illustrated in FIG. 10, the output voltage Vo1 of the second block 15 is input to the input terminal Tic through the capacitors C2*a* and C3*a*. For that reason, in previous Step T28, both terminals of the capacitors C2*a* and C3*a* are connected to the analog ground line to put in the reset state.

Thereafter, the first block 14 and the second block 15 repeats "the cyclic hold operation of the first block 14", "the cyclic sample operation of the second block 15" illustrated in FIG. 9, and "the cyclic sample operation of the first block", "the cyclic hold operation of the second block" illustrated in FIG. 10, in Steps T30, T31, T32, T33, and so on. The control unit 9 performs a predetermined digital integration process on the quantization value generated with the use of the ΔΣ type A/D conversion processing in Steps T21 to T28 and T29 by a digital integrator to generate the higher bits. The control unit 9 sequentially adds the quantization values Qo1 and Qo2 obtained by the cyclic type A/D conversion processing in Step T30 and the subsequent steps to the values of the generated higher bits while shifting the digit in combination, and outputs the addition result as the A/D conversion result. In this way, the final A/D conversion result is obtained.

Figure 12:
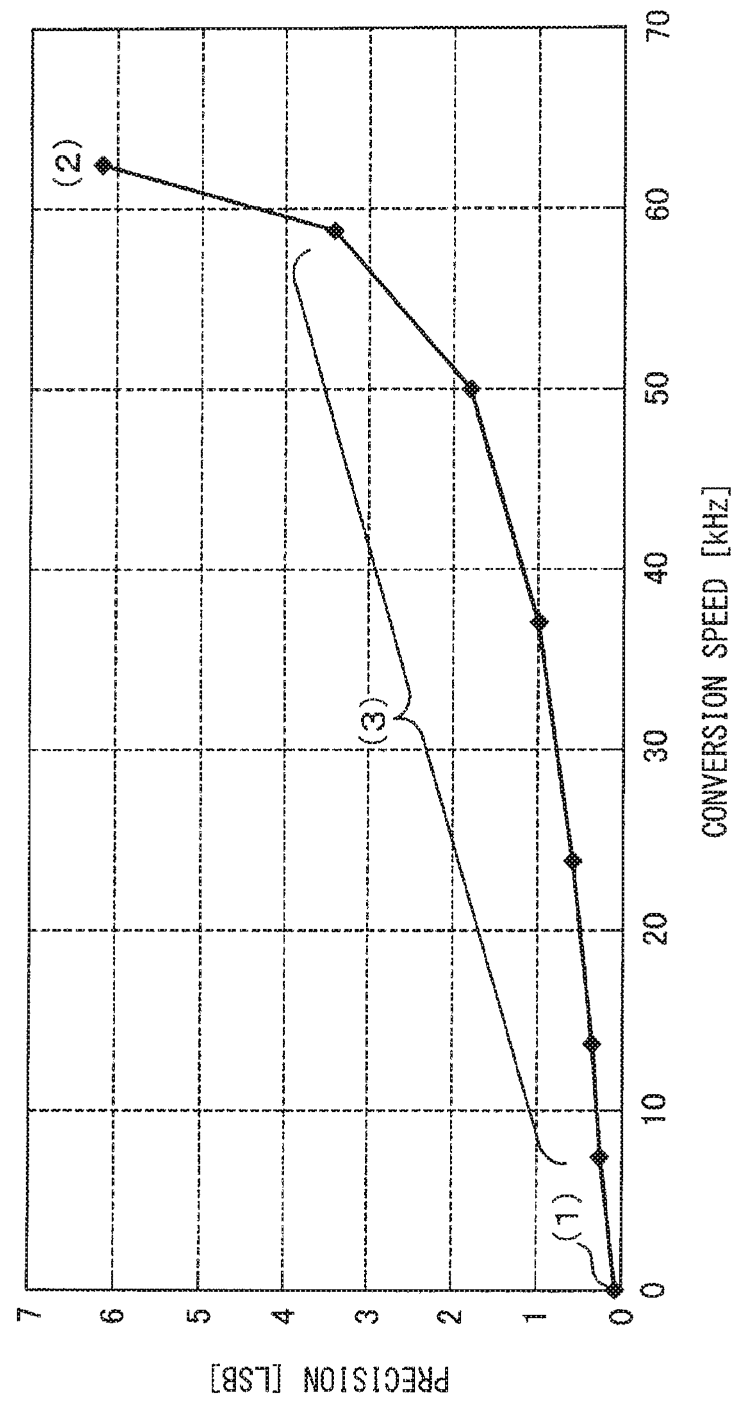
FIG. 12 is a diagram illustrating a simulation result showing a comparison among the ΔΣ mode, the cyclic mode, and the hybrid mode with each other.

FIG. 12 illustrates a simulation result of an A/D conversion speed and an accuracy of the A/D conversion in the respective operation modes of (1) the ΔΣ mode, (2) the cyclic mode, and (3) the hybrid mode. In this example, as the condition of the simulation, a relative accuracy of a capacitance value of each capacitor is set to ±0.1% so as to obtain a practical value. In (3) the hybrid mode, in 14 bits, the number of quantization bits for performing the processing in the ΔΣ mode is set as n (n=1 to 13) bits, and the number of quantization bits for performing the processing in the cyclic mode is set as (14−n) bits.

Figure 13:
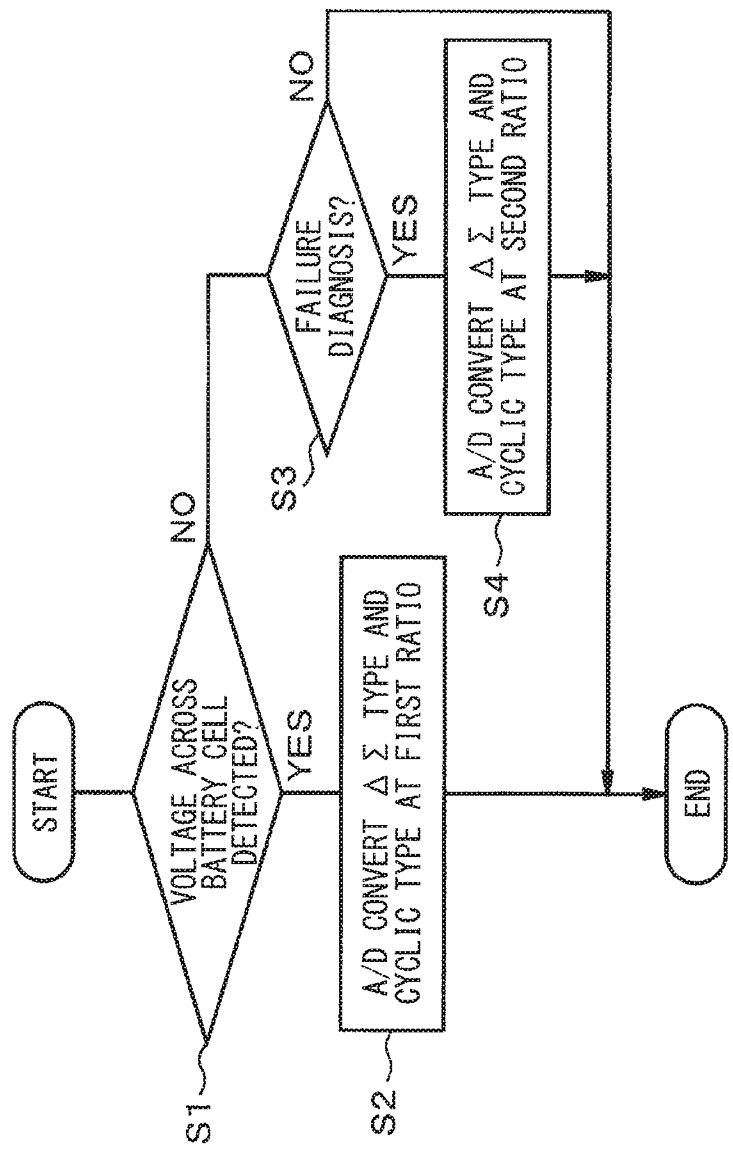
FIG. 13 is a flowchart schematically illustrating an example of a mode change process according to a change in an object to be detected.

As described above, when the A/D conversion device 6 performs the quantization in the cyclic mode, the processing speed becomes higher than the quantization processing speed in the ΔΣ mode. Conversely, the conversion accuracy when the A/D conversion device 6 quantizes the analog input signal Vin in (1) the ΔΣ mode becomes higher than the conversion accuracy in (2) the cyclic mode. In (3) the hybrid mode corresponding to an intermediate between (1) the ΔΣ mode and (2) the cyclic mode, it is confirmed that the mutual benefits of (1) the ΔΣ mode and (2) the cyclic mode can be accepted. In this state, in (3) the hybrid mode, the conversion accuracy can be improved if the number of processing bits caused by the ΔΣ type A/D conversion is made larger. Conversely, the processing speed can be increased if the number of processing bits in the cyclic type A/D conversion is made larger. It may be reasonable to change the processing speed and the conversion accuracy according to an intended purpose so as to accept the mutual benefits. A case in which the A/D conversion processing is performed while the mode switching is performed with a condition is illustrated in FIG. 13.

The control unit 9 of the voltage detection device 1 determines whether a voltage detection process of the battery cells 3 is performed in Step S1, or a failure diagnosis process is performed in Step S3. When the control unit 9 determines to be positive in Step S1, and detects a voltage across the battery cells 3, the control unit 9 detects inter-terminal signals of one or more battery cells 3 of the multiple battery cells 3. In such a case, a relatively high conversion accuracy is required. For example, the voltage detection process of the battery cells 3 may be a low-speed process of about several hundreds μseconds, but the conversion accuracy may be required with a high accuracy of 14 to 16 bits. In this state, the control unit 9 sets the operation mode of the A/D conversion device 6, for example, as a first ratio at which the processing ratio of the ΔΣ type is set to be higher and the processing ratio of the cyclic type is set to be lower. When the conversion accuracy is set to be highest, the control unit 9 may operate the A/D conversion device in (1) the ΔΣ mode where the processing ratio of the ΔΣ type is set as 100%, and the processing ratio of the cyclic type is set as 0%. In this state, the A/D conversion device 6 performs the A/D conversion processing with the processing ratio of the ΔΣ type and the cyclic type as the first ratio in Step S2.

Conversely, when the control unit 9 of the voltage detection device 1 determines to perform the failure diagnosis process in Step S4, acquires a failure diagnosis signal during the failure diagnosis, and monitors whether a failure is present, or not, the processing speed may be prioritized to the conversion accuracy in order to detect the failure quickly. When performing the failure diagnosis process, the voltage detection device 1 is required to perform the processing, for example, at a medium accuracy of 10 to 14 bits, and at a medium speed of several tens microseconds. In this case, the control unit 9 sets the operation mode of the A/D conversion device 6, for example, as a second ratio at which the processing ratio of the ΔΣ type is set to be lower and the processing ratio of the cyclic type is set to be higher. In order that the control unit 9 allows the A/D conversion device 6 to perform the processing most quickly, the control unit 9 may operate the A/D conversion device 6 in (2) the cyclic mode in which the processing ratio of the ΔΣ type is set to 0%, and the processing ratio of the cyclic type is set to 100%. In this way, the detection accuracy and the processing speed can be flexibly adjusted according to a detection purpose.

Meanwhile, "(1) the ΔΣ mode" sets the A/D conversion processing ratio of the ΔΣ type to the cyclic type to 100:0, and "(2) the cyclic mode" sets the A/D conversion processing ratio of the ΔΣ type to the cyclic type to 0:100. The hybrid mode sets the A/D conversion processing ratio of the ΔΣ type to the cyclic type to the other rates (more than 0% and less than 100%).

In the present embodiment, the A/D conversion processing characteristics in (1) the ΔΣ mode, (2) the cyclic mode, and (3) the hybrid mode in which the ΔΣ type and the cyclic type are combined together are used, and the A/D conversion processing ratio of the ΔΣ type and the cyclic type is switched to another according to the voltage detection purpose of the battery cells 3 and the voltage detection purpose during the failure detection. As a result, the processing speed and the detection accuracy can be flexibly changed according to the detection purpose.

In the present embodiment, the control unit 9 sets the mode to the cyclic mode in which the processing ratio of the ΔΣ type is 0% and the processing ratio of the cyclic type is 100%, as a result of which the A/D conversion device 6 can completely perform the processing of (2) the cyclic mode. For that reason, the processing speed can be maximized.

In the present embodiment, the control unit 9 sets the mode to the ΔΣ mode in which the processing ratio of the ΔΣ type is 100% and the processing ratio of the cyclic type is 0%, and changes over the switch 7 to connect the high-order digital filter 8 to a downstream side, as a result of which the A/D conversion device 6 can completely perform the processing of (1) the ΔΣ mode. In this state, the A/D conversion processing is performed in (1) the ΔΣ mode, and the digital filter 8 subjects the A/D conversion result of the second A/D converter 27*b* to the high-order digital filter processing, as a result of which an accuracy beyond the conversion accuracy in (3) the hybrid mode can be achieved. For that reason, if the A/D conversion device 6 completely performs the processing of (1) the ΔΣ mode, the conversion accuracy can be maximized.

For example, up to now, the A/D conversion device of a multi-mode in which a ΔΣ system or a pipeline system is combined together has been proposed in Patent Document 1. In this system of Patent Document 1, when the pipeline system is used, four stages of blocks are required, and when the ΔΣ type processing is performed, two stages of blocks are required. In that case, when the ΔΣ type A/D conversion processing is performed, the circuit use efficiency is low because of the presence of an unused block. In addition, because an arithmetic amplifier is required for each of those stages, a current consumption becomes larger.

In the present embodiment, the operation blocks 14 and 15 in (1) the ΔΣ mode have two stages of blocks in total, and the operation blocks 14 and 15 in (2) the cyclic mode have two stages of blocks in total. In addition, the operation blocks 14 and 15 in (3) the hybrid mode have two stages of blocks in total. For that reason, the circuit configuration operable in any mode can be shared, and the circuit use efficiency can be improved as compared with the conventional system. When the number of blocks in the hybrid mode is taken into consideration, the balance of the hybrid mode function can be optimized with the provision of two stages of blocks.

In more detail, in (1) the ΔΣ mode, (2) the cyclic mode, and (3) the hybrid mode, the arithmetic amplifier 24*a* of the respective blocks 14 and 15 is shared and operated. For that reason, the circuit use efficiency can be improved, and the current consumption can be also reduced. In more detail, with the use of the same circuit configuration, the A/D conversion device 6 is enabled to achieve (1) the ΔΣ mode in which the processing ratio of the ΔΣ type is set to 100% and the processing ratio of the cyclic type is set to 0%, (2) the cyclic mode in which the processing ratio of the ΔΣ type is set to 0% and the processing ratio of the cyclic type is set to 100%, and (3) the hybrid mode that is the intermediate between the ΔΣ mode and the cyclic mode. For that reason, the A/D conversion device 6 is enabled to execute the respective modes without remarkable addition of the circuits corresponding to the respective modes.

Further, the operative description of the cyclic mode in the present embodiment can be summarized as follows. When the control unit 9 operates the A/D conversion device 6 in the cyclic mode, the control unit 9 allows the first block 14 to perform the input sample operation, and allows the second block 15 to perform the reset operation. In this state, the control unit 9 allows the capacitors C2*a* and C3*a* of the capacitor switching circuits 21*a* and 22*a* to input and sample the analog input signal Vin, and allows the second A/D converter 27*b* of the quantization unit 13 to receive the analog input signal Vin. The control unit 9 connects the digital output of the second A/D converter 27*b*, which is obtained in this state, to the capacitor C2*a* of the capacitor switching circuits 21*a* and 22*a* through the D/A converter 26*a*, and allows the arithmetic amplifier 24*a* to perform the MDAC processing. In this state, the control unit 9 allows the capacitors C2*b* and C3*b* of the capacitor switching circuits 21*b* and 22*b* to cyclically sample the output voltage Vo1 of the arithmetic amplifier 24*a* in the first block 14.

The control unit 9 connects the digital output of the first A/D converter 27*a*, which is obtained in this state, to the capacitor C2*b* of the capacitor switching circuits 21*b* and 22*b* through the D/A converter 26*b*, and allows the arithmetic amplifier 24*b* to perform the MDAC processing. Also, the control unit 9 allows the capacitors C2*a* and C3*a* of the capacitor switching circuits 21*a* and 22*a* to cyclically sample the output voltage Vo1 of the arithmetic amplifier 24*b*. Further, the control unit 9 sets the digital output obtained by inputting the output voltage Vo1 of the arithmetic amplifier 24*b* to the second A/D converter 27*b* as lower bits. Subsequently, the control unit 9 repetitively quantizes the process of acquiring the higher bits and the process of acquiring the lower bits from a most significant bit to a least significant bit. With the above processing, the control unit 9 is enabled to completely process all of the bits in the cyclic mode.

Vehicle manufacturers perform control processing inside of the vehicles of various types with the use of a variety of algorithms. A monitoring schedule of the voltage detection device 1 installed into the vehicles is variously changed according to the vehicle control processing. According to the present embodiment, the control unit 9 changes the switching control states of the respective switches, and configured to change the A/D conversion processing ratio of the ΔΣ type and the cyclic type, and configured to flexibly change the processing speed and the detection accuracy of the A/D conversion device 6. For that reason, the A/D conversion device 6 is easily incorporated into an electronic control unit for performing various vehicle control processing.

Second Embodiment

Figure 14:
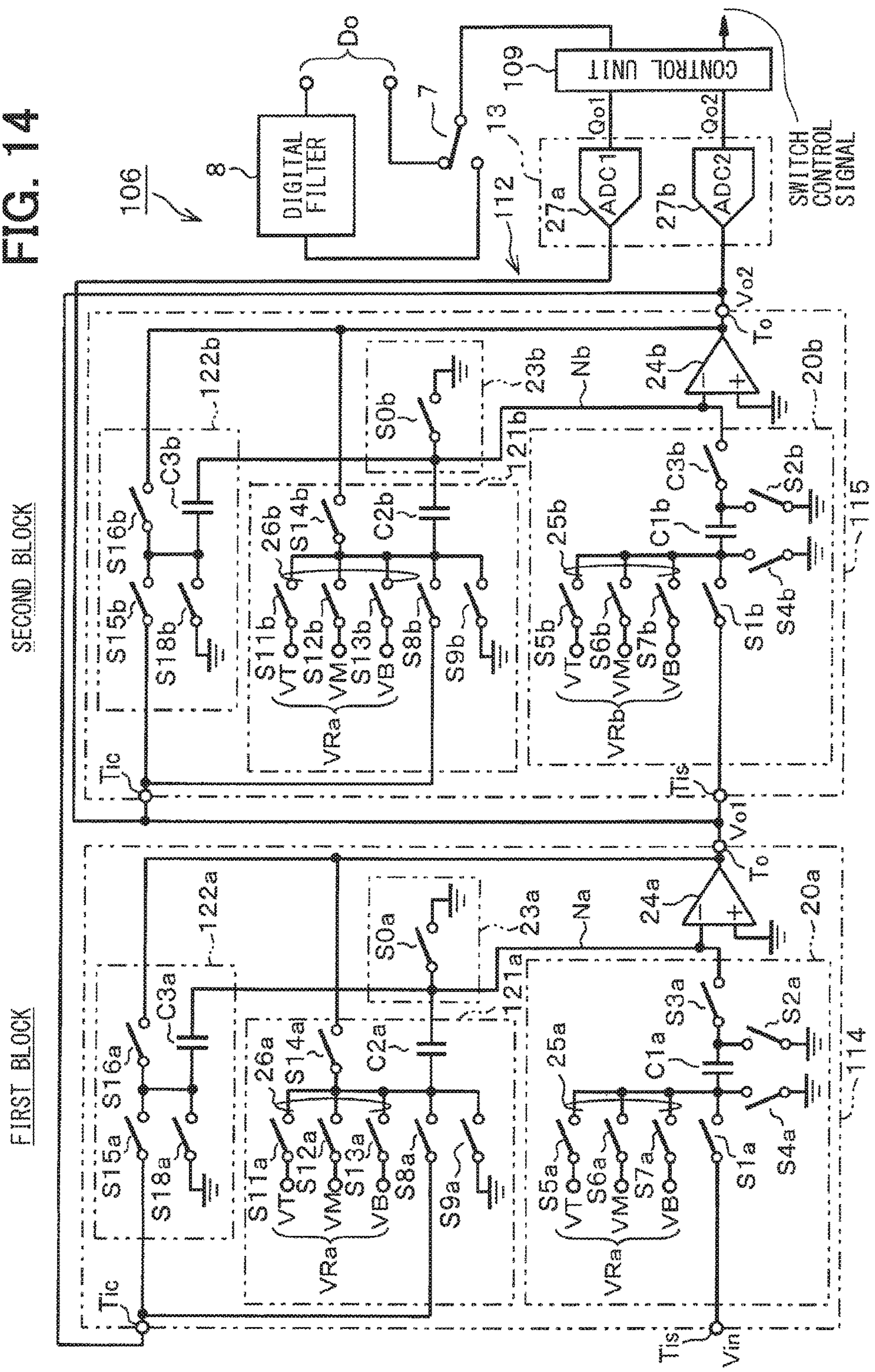
FIG. 14 is an electric configuration diagram of an A/D conversion device according to a second embodiment.

FIGS. 14 to 17 illustrate additional illustrative views of a second embodiment. Portions having the same function as those in the first embodiment are denoted by identical reference numerals, and their description will be omitted. FIG. 14 illustrates a configuration example of an A/D conversion device 106. The A/D conversion device 106 illustrated in FIG. 14 includes a signal processing unit 112, a quantization unit 13, and a control unit 109. The signal processing unit 112 includes a first block 114 and a second block 115. The first block 114 includes capacitor switching circuits 20*a*, 121*a*, and 122*a*, and the second block 115 includes capacitor switching circuits 20*b*, 121*b*, and 122*b*. The capacitor switching circuit 121*a* includes switches S8*a*. S9*a*, and S11*a* to S14*a* together with a capacitor C2*a*, and the capacitor switching circuit 122*a* includes switches S15*a*, S16*a*, and S18*a* together with a capacitor C3*a*.

A difference of the A/D conversion device 106 from the A/D conversion device 6 in the first embodiment resides in that the switches S10*a*, S17*a*, and S21 are not disposed between an input terminal Tis and respective circuits 121*a*, 122*a*, 13. The A/D conversion device 106 is also different from that A/D conversion device 6 in the first embodiment in that the switch S20 is not disposed between the output terminal To of the second block 115 and the quantization unit 13.

The switches S10*a*, S17*a*, and S21 illustrated in FIG. 2 represent switches that are turned on during "the input sample operation of the first block 14 in the cyclic mode" which has been described with reference to FIG. 8. "The input sample operation of the first block 14 in the cyclic mode" is a process performed when the analog input signal Vin is input to the respective capacitors C2*a* and C3*a* of the capacitor switching circuits 21*a* and 22*a*. In this state, the control unit 9 turns on the switches S10*a*, S17*a*, and S21. During the operation in the subsequent cyclic mode, the operation in the ΔΣ mode, and the operation in the hybrid mode, the control unit 9 puts those switches S10*a*, S17*a*, and S21 to be turned off. The switch S20 is always turned on except for a reset state.

The A/D conversion device 106 according to the present embodiment becomes in the same operating state as that when the switches S10*a*, S17*a*, and S21 are held off. Because the A/D conversion device 106 according to the present embodiment performs the same operation as the operation described in the first embodiment in the processing other than "the input sample operation of the first block 14 in the cyclic mode", the detailed description of the operation will be omitted. In the present embodiment, the operation instead of the operation of inputting the analog input signal Vin to the capacitors C2*a* and C3*a* at an initial timing of "the cyclic mode" will be mainly described.

Figure 15:
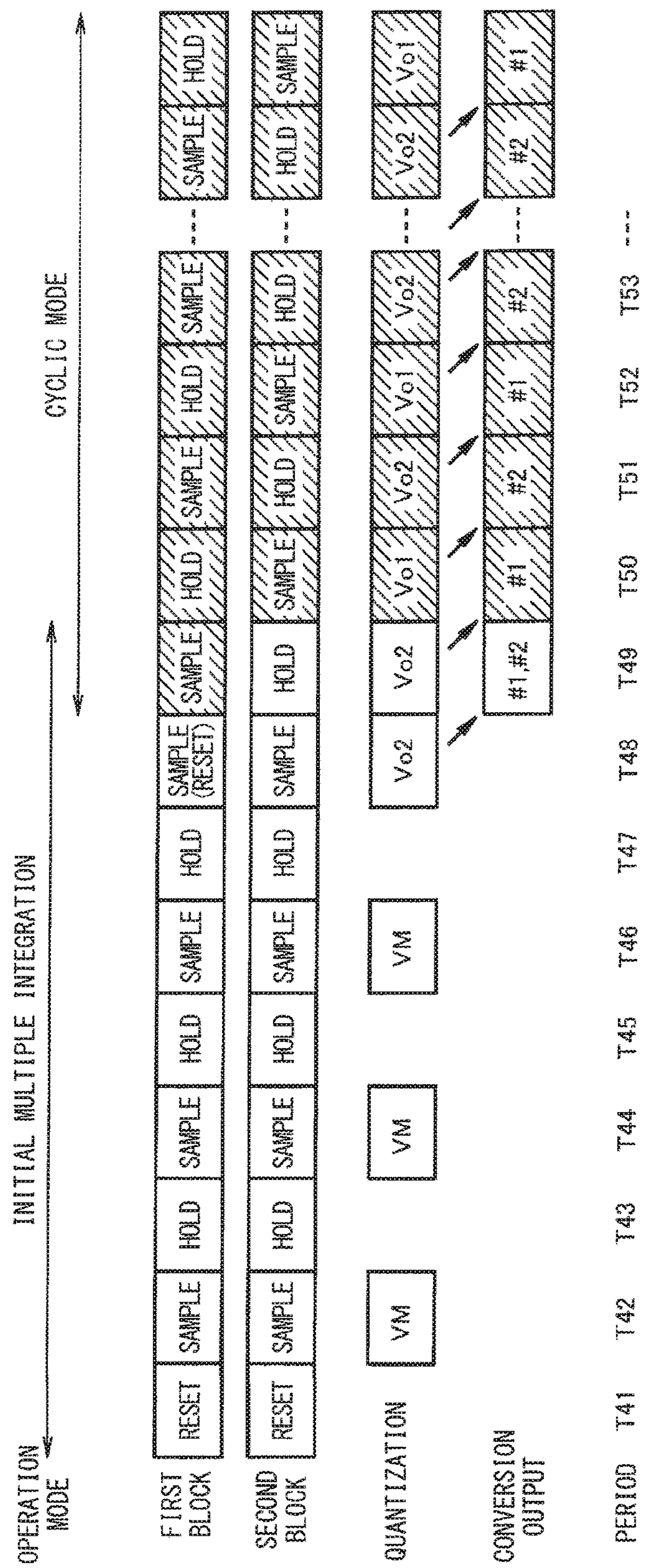
FIG. 15 is a timing chart schematically illustrating a processing procedure in a cyclic mode for one cycle.

FIG. 15 illustrates a timing chart of a processing procedure in the cyclic mode for one cycle. In FIG. 15, unhatched "Reset", "Sample", and "Hold" represent the reset operation, the initial sample operation, and the initial hold operation, respectively. Hatched "Sample" and "Hold" illustrate respective timings at which the cyclic sample operation and the cyclic hold operation are performed. As illustrated in FIG. 15, after the first block 114 and second block 115 have performed the reset operation in Step T41, the first block 14 and the second block 15 perform the initial sample operation at the same time in Step T42. Thereafter, the first block 114 and the second block 115 perform the initial hold operation at the same time in Step T43. The first block 114 and the second block 115 repeat the initial sample operation and the initial hold operation for multiple times (for example, three times in FIG. 15) in Steps T44 to T47.

Thereafter, in Step T48, the second block 115 performs the initial sample operation while the first block 114 performs the reset operation. Thereafter, in Step T49, the second block 115 performs the cyclic hold operation while the first block 114 performs the cyclic sample operation. Thereafter, in Step T50, the second block 115 performs the cyclic sample operation while the first block 114 performs the cyclic hold operation. Subsequently, the same processing as those in Steps T49 and T50 are repetitively performed in Steps T51, T52, T53, and so on. In this state, the processing in the cyclic mode described in the first embodiment is performed.

(Reset Operation of Both Blocks 114 and 115)

The reset operation of the first block 114 and the second block 115 in the cyclic mode is identical with the reset operation of the first block 14 and the second block 15 in the ΔΣ mode illustrated in FIG. 4, and its description will be omitted. Meanwhile, before obtaining the data output Do in the cyclic mode, the control unit 109 disconnects the control unit 109 from the digital filter 8, and changes over the switch 7 so as to obtain the data output Do as it is.

(Initial Sample Operation of First Block 114)

Figure 16:
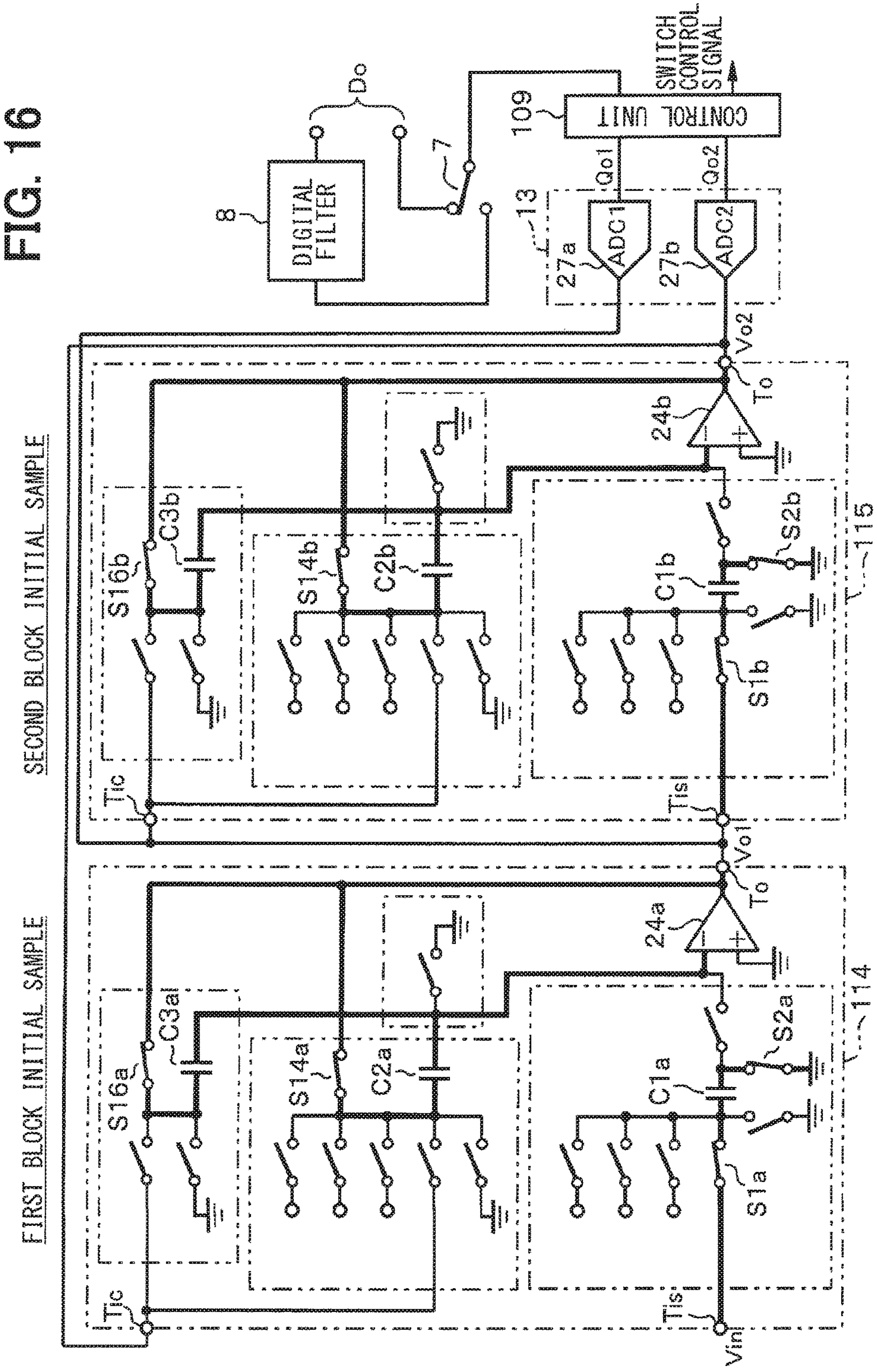
FIG. 16 is an illustrative view schematically illustrating one operation stage in the cyclic mode (No. 1)

As illustrated in FIG. 16, in the initial sample operation of the first block 114, the control unit 109 turns on the switches S1*a*, S2*a*, S14*a*, and S16*a*, and turns off the other switches. The control unit 109 turns on the switches S1*a* and S2*a* to input the analog input signal Vin to the other terminal of the capacitor C1*a*. As a result, the capacitor C1*a* is charged with the analog input signal Vin. On the other hand, the control unit 109 turns on the switches S14*a* and S16*a*, as a result of which the capacitors C2*a* and C3*a* are connected in parallel to each other between the inverting input terminal of the arithmetic amplifier 24*a* and the output terminal.

(Initial Sample Operation of Second Block 115)

As illustrated in FIG. 16, in the initial sample operation of the second block 115, the control unit 109 turns on the switches S1*b*, S2*b*, S14*b*, and S16*b*, and turns off the other switches. In this state, the control unit 109 turns on the switches S1*b* and S2*b* to input the output voltage Vo1 of the output terminal To in the first block 114 to the other terminal of the capacitor C1*b*. In this state, the capacitor C1*b* is charged with the output voltage Vo1 of the first block 114. On the other hand, the capacitors C2*b* and C3*b* are connected in parallel to each other between the inverting input terminal and the output terminal of the arithmetic amplifier 24*b*.

(Initial Hold Operation of First Block 114)

Figure 17:
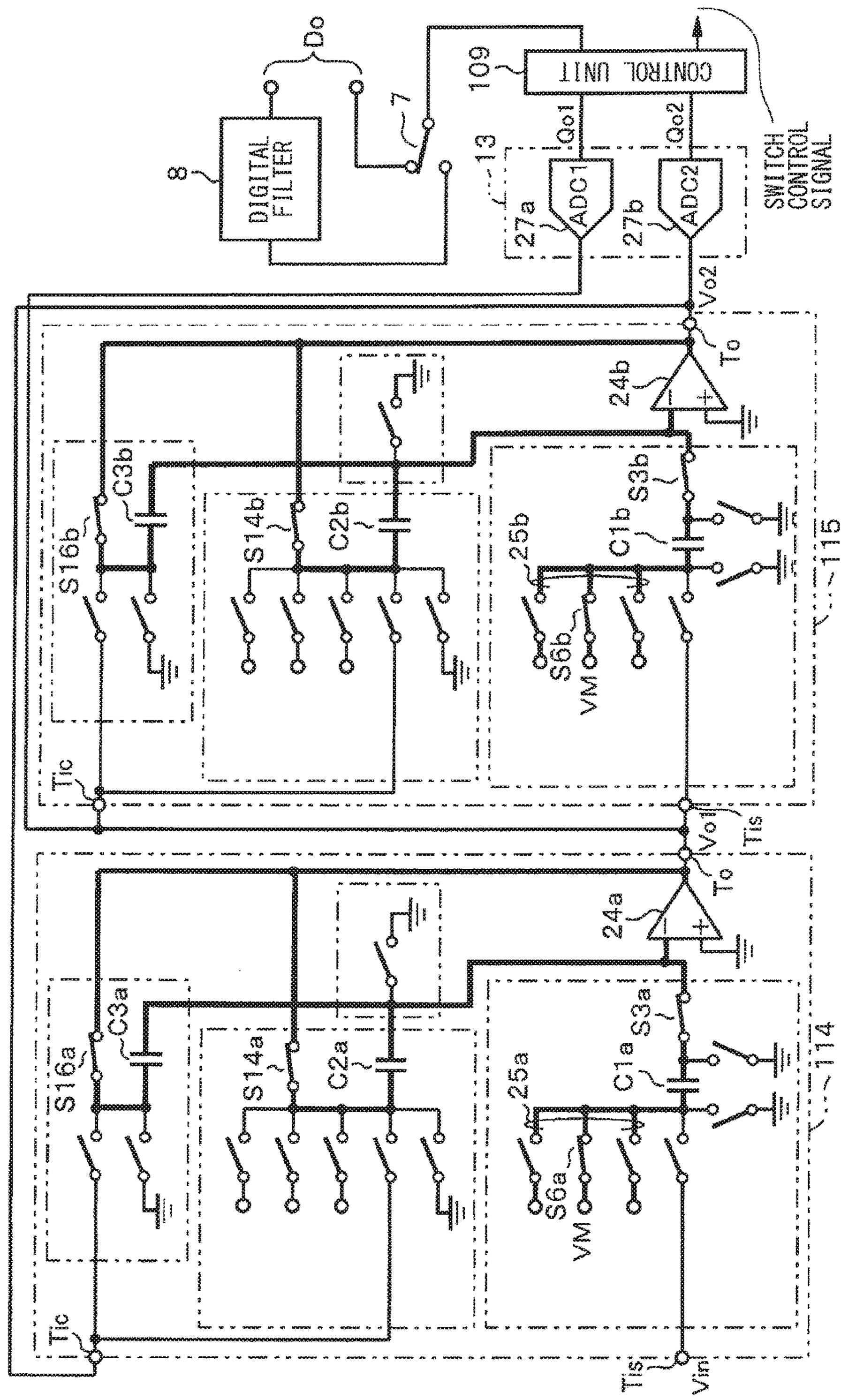
FIG. 17 is an illustrative view schematically illustrating one operation stage in the cyclic mode (No. 2)
Figure 18:
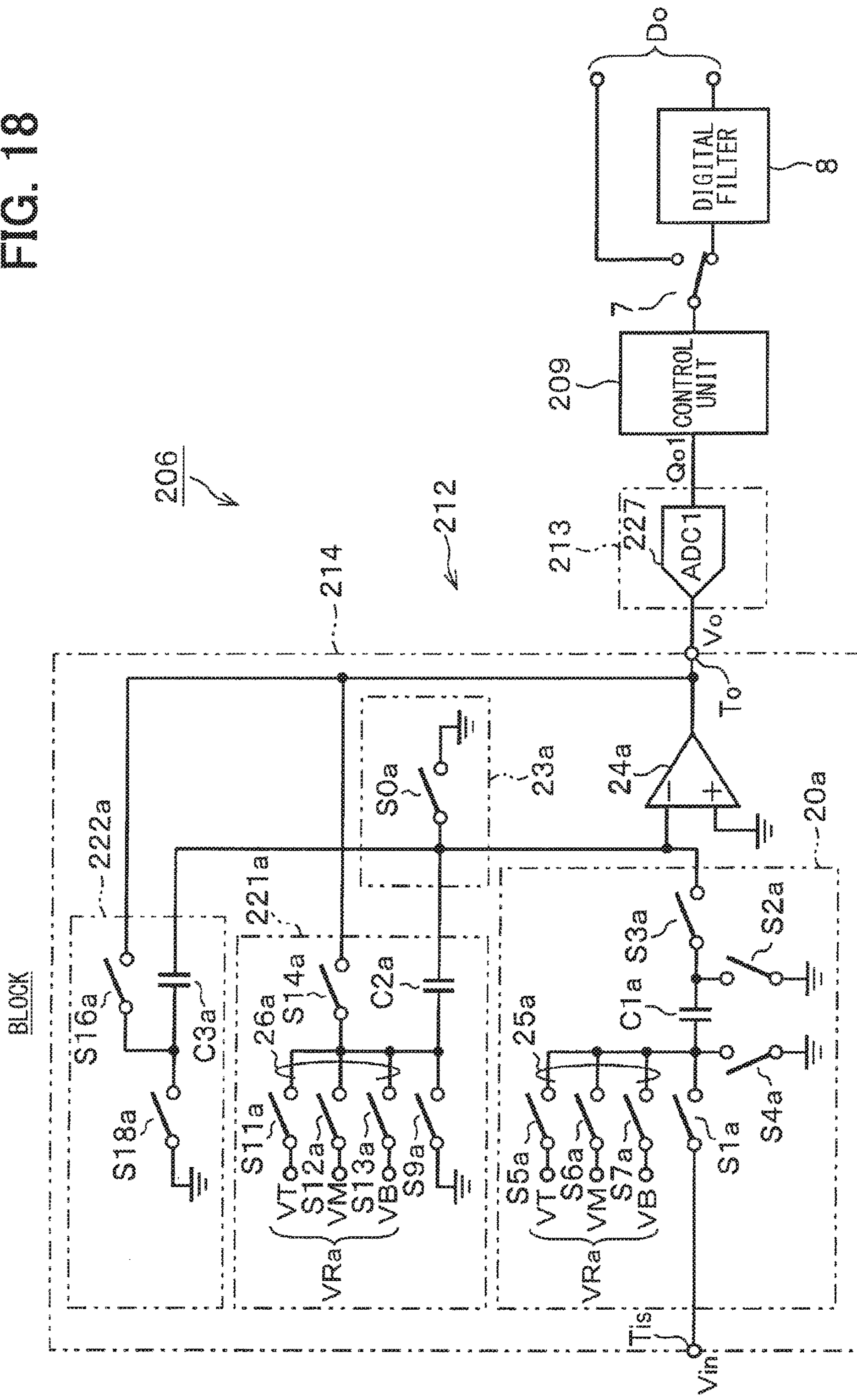
FIG. 18 is an electric configuration diagram of an A/D conversion device according to a third embodiment.

As illustrated in FIG. 17, in the initial hold operation of the first block 114, the control unit 109 turns on the switches S6*a*, S14*a*, and S16*a*, and turns off the other switches. The control unit 109 turns on the switch S6*a* to supply an intermediate level VM that is a predetermined intermediate fixed value to the other terminal of the capacitor C1*a* from the D/A converter 25*a*. In this state, the capacitors C2*a* and C3*a* are held to be interposed between the inverting input terminal and the output terminal of the arithmetic amplifier 24*a*.

In this state, the arithmetic amplifier 24*a* and the capacitors C1*a* to C3*a* configure the charge distribution circuit and the integrator circuit. The residual charge fed back after subtracting the charge corresponding to the conversion output VM of the D/A converter 25*a* from the charge accumulated in the capacitor C1*a* during the initial sample operation is again distributed to the capacitors C2*a* and C3*a*.

(Initial Hold Operation of Second Block 115)

As illustrated in FIG. 17, in the initial hold operation of the second block 115, the control unit 109 turns on the switches S6*b*, S14*b*, and 16*a*), and turns off the other switches. The control unit 109 turns on the switch S6*b* to supply an intermediate level VM that is a predetermined intermediate fixed value to the other terminal of the capacitor C1*b* from the D/A converter 25*b*. In this state, the capacitors C2*b* and C3*b* are held to be interposed between the inverting input terminal of the arithmetic amplifier 24*b* and the output terminal.

In this state, the arithmetic amplifier 24*b* and the capacitors C1*b* to C3*b* configure the charge distribution circuit and the integrator circuit. The residual charge fed back after subtracting the charge corresponding to the conversion output VM of the D/A converter 25*b* from the charge accumulated in the capacitor C1*b* during the initial sample operation is again distributed to the capacitors C2*b* and C3*b*.

As illustrated in FIG. 15, the first block 114 and the second block 115 repeats the initial sample operation and the initial hold operation for multiple times (for example, three times). In this state, when a voltage gain of the first block 114 is denoted by a1, and a voltage gain of the second block 115 is denoted by a2, the initial sample operation and the initial hold operation are repeated three times, and the output voltage Vo2 becomes a voltage of (3×a1×a2) times of the analog input signal Vin. The details can be expressed as follows.

Immediately after the reset, (the output voltage Vo1(0) of the first block 114)=0, and (the output voltage Vo2(0) of the second block 115)=0 are met. After a first initial hold operation, (the output voltage Vo1(1) of the first block 114)=a1×Vin Vo1(0), and (the output voltage Vo2(1) of the second block 115)=a2×Vo1(0) Vo2(0) are met. After a second initial hold operation, (the output voltage Vo1(2) of the first block 114)=a1×Vin Vo1(1), and (the output voltage Vo2(2) of the second block 115)=a2×Vo1(1)+Vo2(1) are met. After a third initial hold operation, (the output voltage Vo1(3) of the first block 114)=a1×Vin Vo1(2), and (the output voltage Vo2(3) of the second block 115)=a2×Vo1(2)+Vo2(2) are met. For that reason, the output voltage Vo2(3) of the second block 115 after the third initial hold operation becomes 3×a1×a2×Vin.

As illustrated in FIG. 15, the initial sample operation and the initial hold operation are repeated for multiple times. Thereafter, the same state as that at the time of the completion of the ΔΣ type A/D conversion processing in (3) the hybrid mode is obtained, and thereafter the cyclic sample operation in the cyclic mode and the processing of the cyclic hold operation are performed. The contents have the same processing contents as the cyclic sample operation and the cyclic hold operation of the cyclic type in the hybrid mode.

The control unit 109 sequentially adds the conversion outputs of the quantization values Qo1 and Qo2 while shifting the digit, and obtains the addition result as the A/D conversion result. Subsequently, the control unit 109 corrects an impact of the obtained A/D conversion result on the gain described above (3×a1×a2×Vin) by digital arithmetic processing, and outputs the corrected result as a final A/D conversion result. With the above processing, even if the switches S10*a*, and S21 are not provided, the processing in the cyclic mode can be completely performed.

In short, the cyclic mode according to the present embodiment can be operatively expressed as follows. When the mode switches to the cyclic mode, the control unit 109 performs the operation of allowing the capacitor C1*a* of the capacitor switching circuit 20*a* for the analog signal input to initially sample the analog input signal Vin, the operation of supplying a predetermined intermediate fixed value VM to the capacitor C1*a* of the capacitor switching circuit 20*a* for the analog signal input through the D/A converter 25*a*, integrating the intermediate fixed value by the arithmetic amplifier 24*a*, and initially holding the output voltage of the arithmetic amplifier 24*a*, the operation of allowing the capacitor C1*b* in the capacitor switching circuit 20*b* for the signal input to initially sample the output voltage of the arithmetic amplifier 24*a*, and the operation of supplying the predetermined intermediate fixed value VM to the capacitor C1*b* of the capacitor switching circuit 20*b* for the signal input through the D/A converter 25*b*, integrating the supplied intermediate fixed value by the second arithmetic amplifier 24*b*, and initially holding the output voltage of the second arithmetic amplifier 24*b*, for multiple times. Thereafter, the control unit 109 discharges the accumulated charge in the respective capacitors C2*a* and C3*a* of the capacitor switching circuits 121*a* and 122*a*.

On the other hand, the control unit 109 connects the digital output obtained by inputting the output voltage of the arithmetic amplifier 24*b* to the A/D converter 27*b* to the capacitors C2*a* and C3*a* of the capacitor switching circuits 121*a* and 122*a* through the D/A converter 26*a*, allows the arithmetic amplifier 24*a* to perform the MDAC operation, allows the respective capacitors C2*b* and C3*b* of the capacitor switching circuits 121*b* and 122*b* to cyclically sample the output voltage of the arithmetic amplifier 24*a*, and acquires the digital output obtained by inputting the output voltage of the arithmetic amplifier 24*a* to the A/D converter 27*a* as the higher bits.

The control unit 109 connects the digital output obtained by the A/D converter 27*a* in this state to the capacitors C2*b* and C3*b* of the capacitor switching circuits 121*b* and 122*b* through the D/A converter 26*b*, allows the arithmetic amplifier 24*b* to perform the MDAC operation, allows the capacitors C2*a* and C3*a* of the capacitor switching circuits 121*a* and 122*a* to cyclically sample the output voltage of the arithmetic amplifier 24*b*, and further acquires the digital output obtained by inputting the output voltage of the arithmetic amplifier 24*b* to the A/D converter 27*b* as lower bits of the higher bits, and repeats a process of acquiring the higher bits and the lower bits from a most significant bit to a least significant bit. With the above processing, the cyclic mode can be completely operated.

Similarly, in the present embodiment, when the inter-terminal signal of the battery cells 3 is subjected to the A/D conversion as the analog input signal Vin, the processing ratio of the ΔΣ type and the cyclic type is set as the first rate. When the failure diagnosis signal is subjected to the A/D conversion processing as the analog input signal Vin during the failure diagnosis, the processing ratio of the ΔΣ type and the cyclic type is set as the second rate for operation. As a result the same advantages as those in the first embodiment can be produced. Because of the configuration without the provision of the switches S10*a*, S17*a*, and S21, the circuit can be simplified and the circuit scale can be reduced as compared with the first embodiment.

Third Embodiment

FIGS. 18 to 22 illustrate additional illustrative views of the third embodiment. For example, in "(1) the ΔΣ mode" according to the first embodiment, the accuracy per unit time is more easily enhanced as the number of blocks 14 and 15 cascaded to each other is increased more. For that reason, in order to enhance the detection accuracy and the conversion accuracy more, the number of blocks 14 and 15 may be increased. However, when the number of blocks 14 and 15 is increased to four or more, the system is liable to be unstable, and the accuracy design of the D/A converter is likely to become difficult. Therefore, it may be reasonable to use the blocks 14 and 15 of about one to three stages. An A/D conversion device 206 according to a third embodiment is configured to have one block 214.

The A/D conversion device 206 includes a signal processing unit 212, a quantization unit 213, and a control unit 209. In the present embodiment, the signal processing unit 212 has a primary configuration using one block 214. Portions of the one block 214 different from the first block 14 of the first embodiment will be mainly described. The one block 214 does not include a terminal having the same function as that of the input terminal Tic of the first block 14, and the signal processing unit 212 includes only one input terminal Tis.

The one block 214 includes capacitor switching circuits 20*a*, 221*a*, and 222*a*. The capacitor switching circuit 221*a* includes a D/A converter 26*a*, switches S9*a*, S14*a*, and a capacitor C2*a*. A wiring relationship of the D/A converter 26*a*, the switches S9*a*, S14*a*, and the capacitor C2*a* is identical with that in the interior of the first block 14 in the first embodiment, and their description will be omitted. The capacitor switching circuit 221*a* does not include the switches S8*a* and S10*a* as compared with the capacitor switching circuit 21*a* in the first embodiment.

The capacitor switching circuit 222*a* includes a capacitor C3*a* and switches S16*a* and S18*a*. A wiring relationship of the capacitor C3*a* and the switches S16*a*, S18*a* is identical with the first block 14 in the first embodiment, and their description will be omitted. The capacitor switching circuit 222*a* does not include the switches S15*a* and S17*a* as compared with the capacitor switching circuit 22*a* in the first embodiment. The quantization unit 213 includes one A/D converter 227.

(1) ΔΣ Mode

Figure 19:
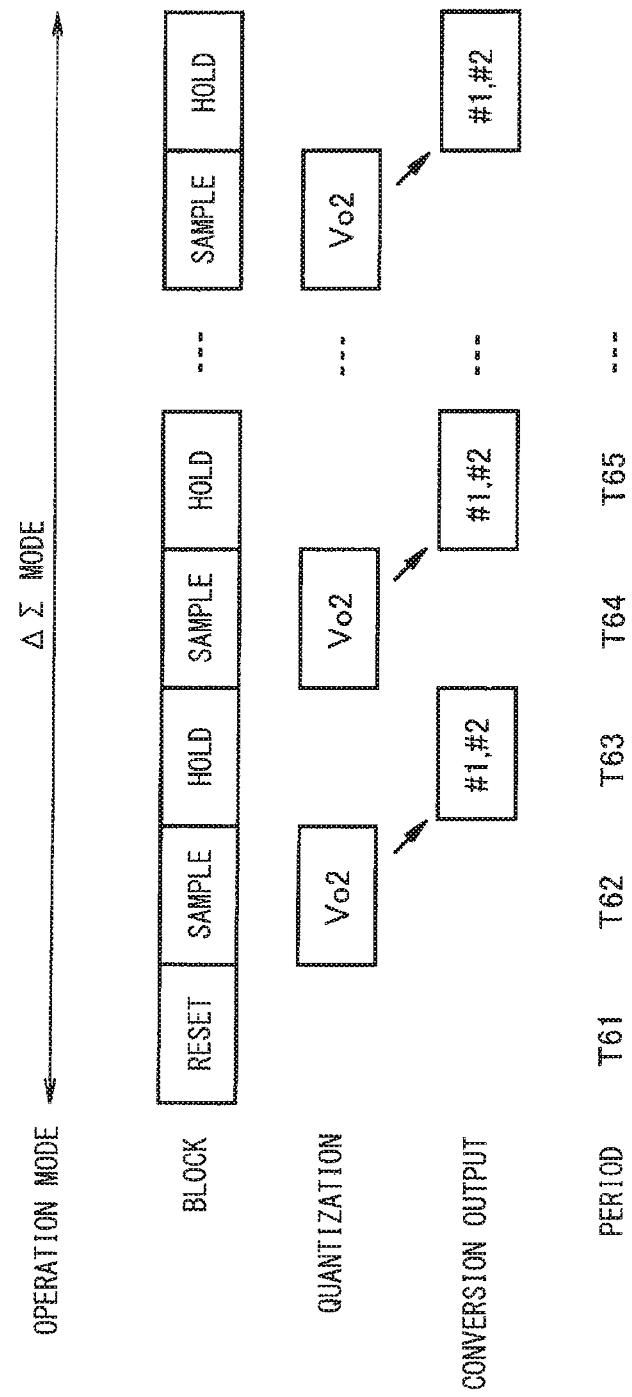
FIG. 19 is a timing chart schematically illustrating a processing procedure in a ΔΣ mode for one cycle.

FIG. 19 is a timing chart schematically illustrating a processing procedure in the ΔΣ mode for one cycle. "Reset", "Sample", and "Hold" illustrated in FIG. 19 represent the reset operation, the ΔΣ sample operation, and the ΔΣ hold operation, respectively. The block 214 of the signal processing unit 212 performs the reset operation in Step T61, and thereafter repeats the ΔΣ sample operation and the ΔΣ hold operation in Steps T62, T63, and so on. In this state, the quantization unit 213 continues to perform the digital output while oversampling those operation for a predetermined number of times, and the digital filter 8 subjects an output value of the quantization unit 213 to low-pass filtering to obtain the data output Do.

(Reset Operation)

Figure 20:
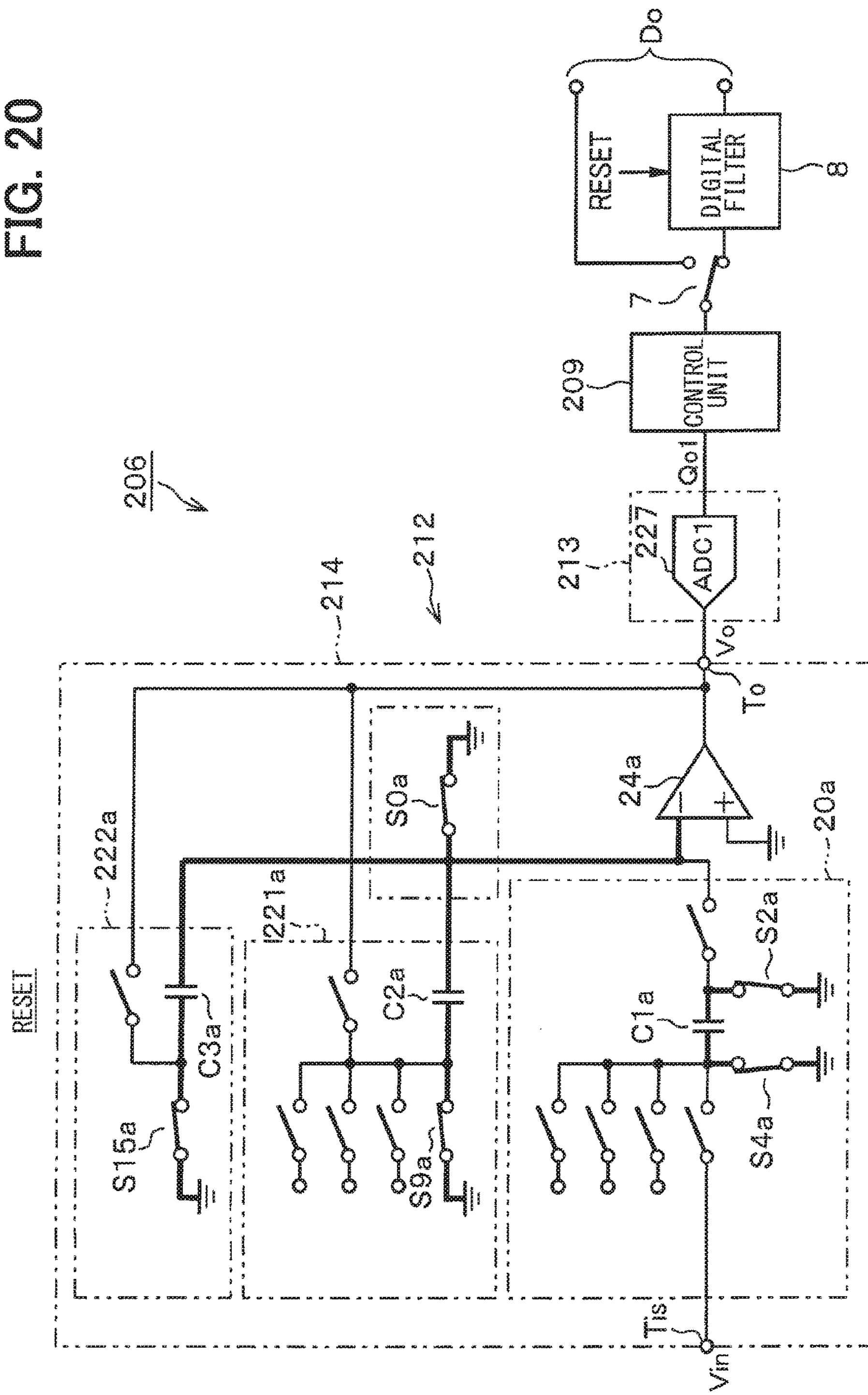
FIG. 20 is an illustrative view schematically illustrating one operation stage in the ΔΣ mode (No. 1)

As illustrated in FIG. 20, the operation of resetting the one block 214 is identical with the operation of resetting the first block 14 in the first embodiment, and therefore its description will be omitted. The control unit 209 resets the digital filter 8 before being set to the ΔΣ mode.

(ΔΣ Sample Operation)

Figure 21:
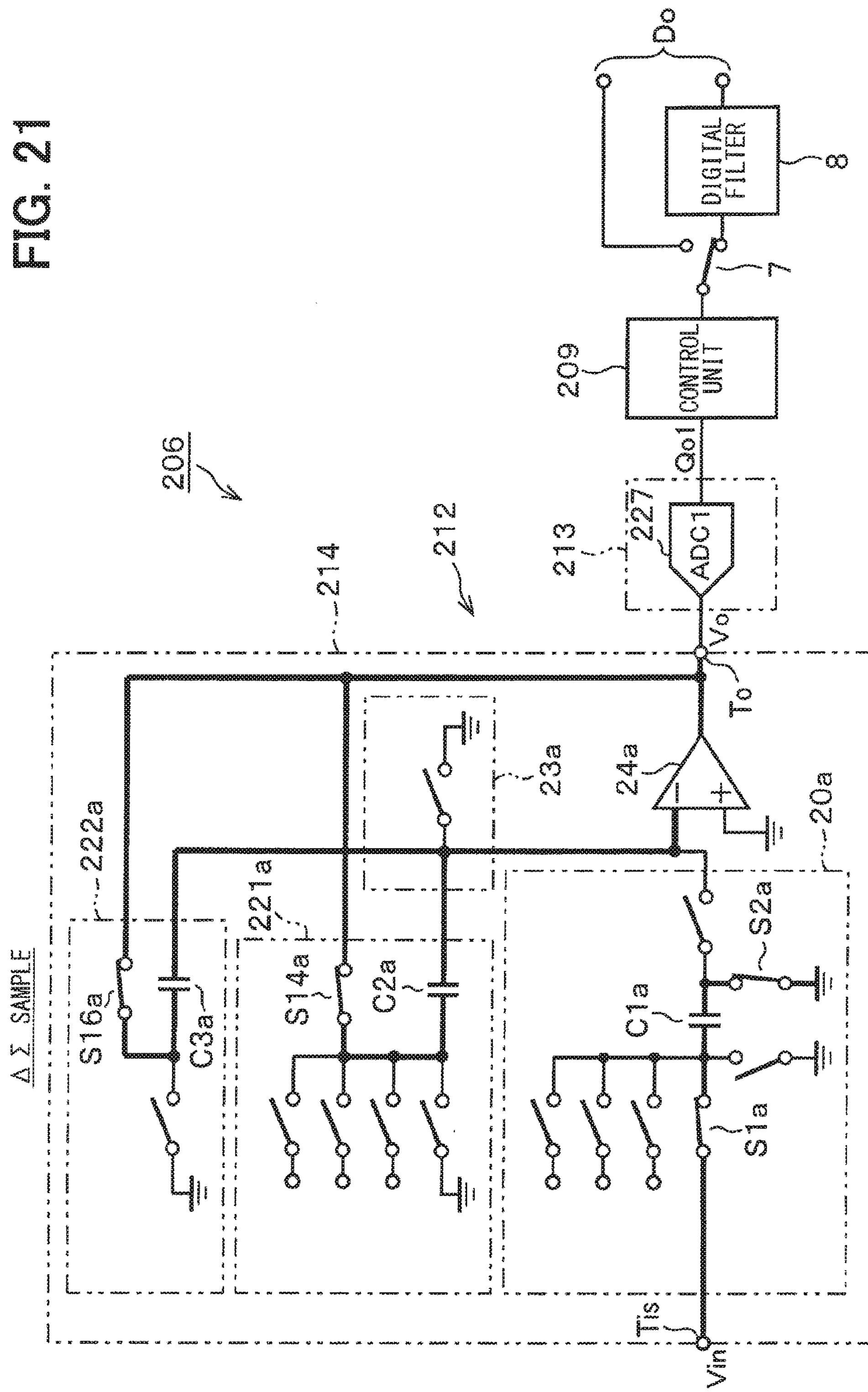
FIG. 21 is an illustrative view schematically illustrating one operation stage in the ΔΣ mode (No. 2)

As illustrated in FIG. 21, the ΔΣ sample operation of the one block 214 is identical with the ΔΣ sample operation of the first block 14 in the first embodiment and the initial sample operation of the first block 114 in the second embodiment.

(ΔΣ Hold Operation)

Figure 22:
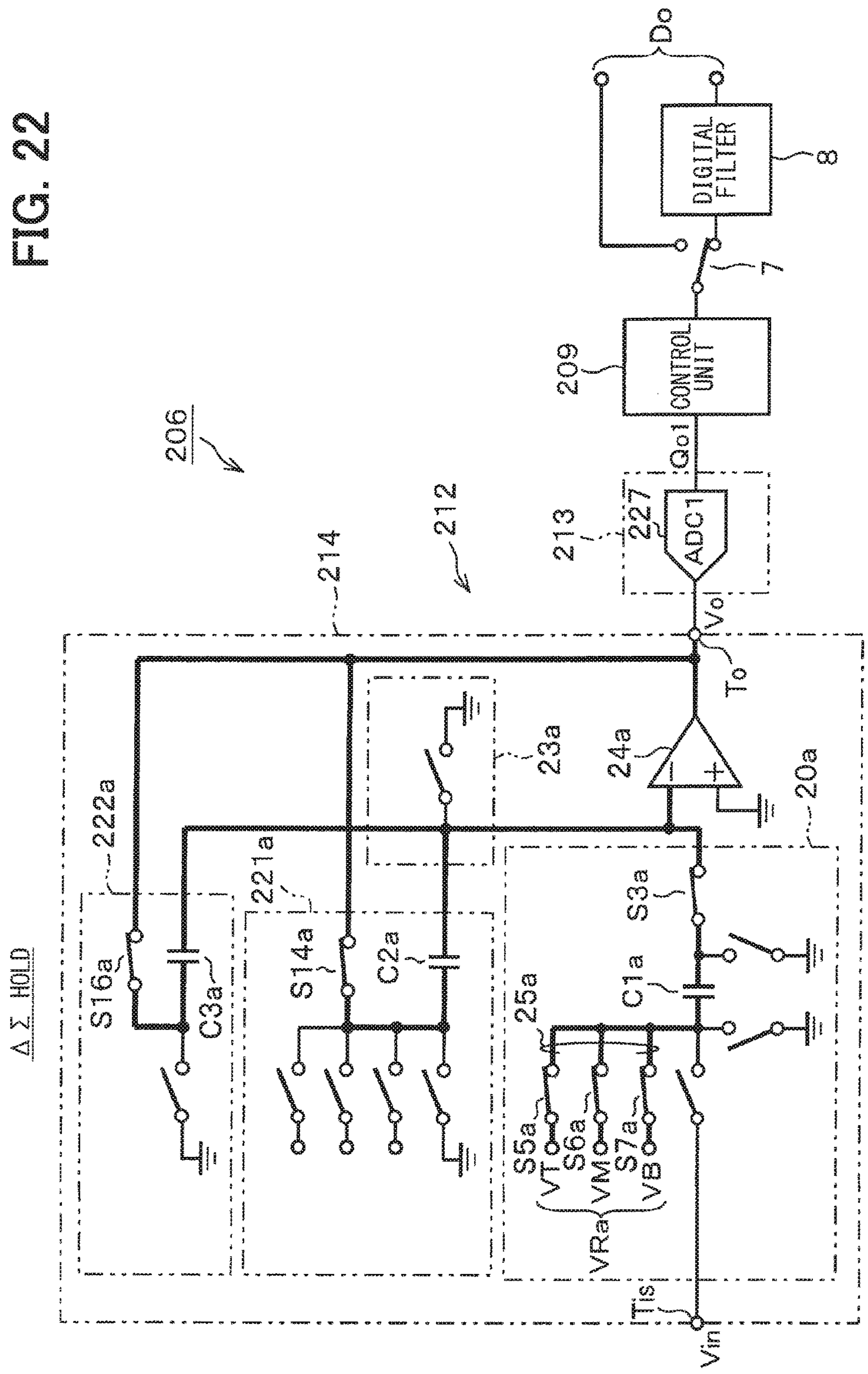
FIG. 22 is an illustrative view schematically illustrating one operation stage in the ΔΣ mode (No. 3)

As illustrated in FIG. 22, the A hold operation of the one block 214 is identical with the A hold operation of the first block 14 in the first embodiment and the initial hold operation of the first block 114 in the second embodiment.

(2) Cyclic Mode

FIGS. 23 to 27 illustrate the respective operating states when executing the cyclic mode. The one block 214 performs the reset operation, then performs the initial sample operation, and thereafter performs the initial hold operation and the initial cyclic sample operation. Thereafter, the one block 214 repetitively performs the cyclic hold operation and the cyclic sample operation.

(Reset Operation)

Figure 23:
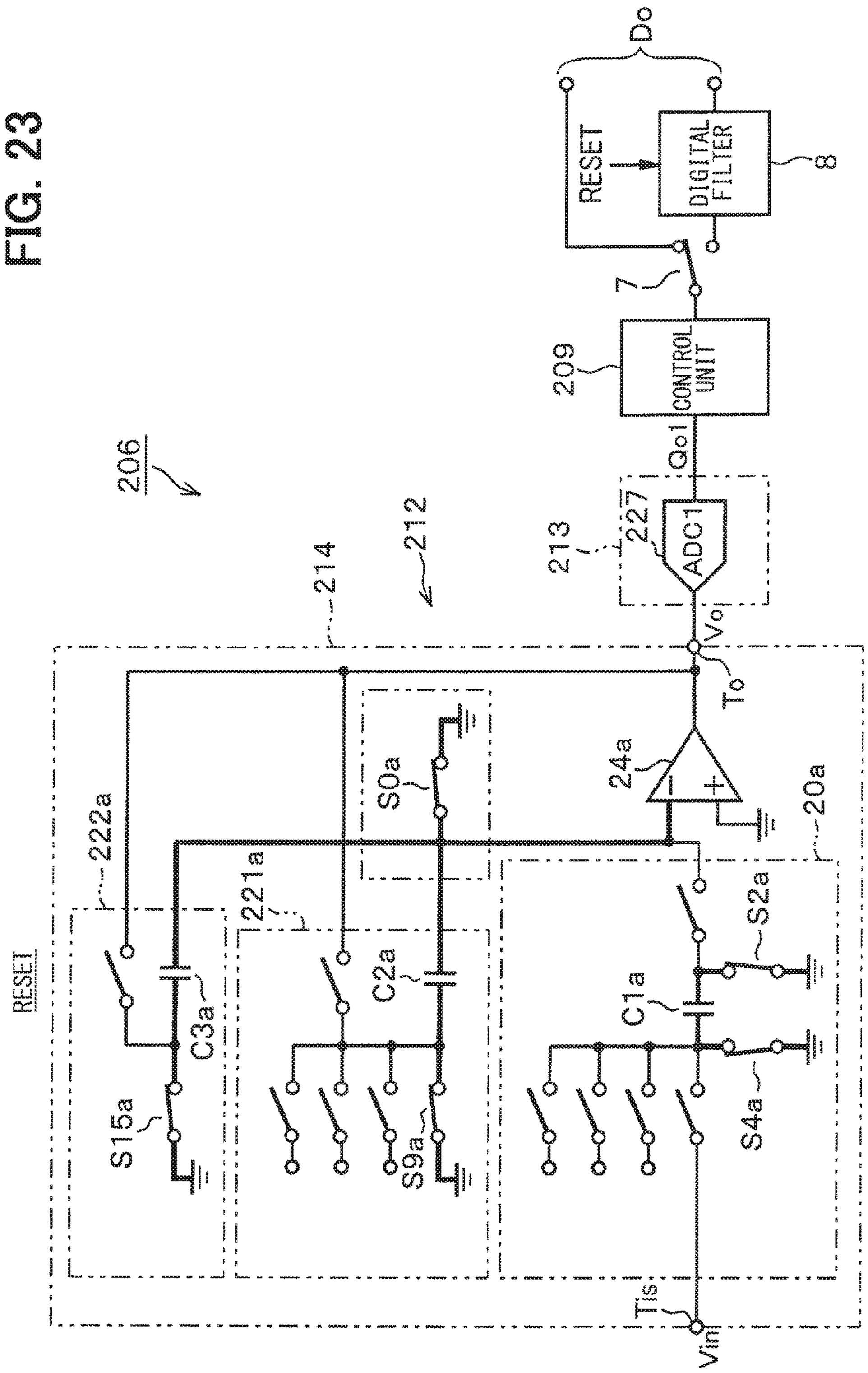
FIG. 23 is an illustrative view schematically illustrating one operation stage in the cyclic mode (No. 1)

As illustrated in FIG. 23, the operation of resetting the one block 214 is identical with the reset operation in the ΔΣ mode illustrated in FIG. 20. The control unit 209 changes over the switch 7 so as to disconnect the conversion output of the A/D converter 227 from the digital filter 8.

(Initial Sample Operation)

Figure 24:
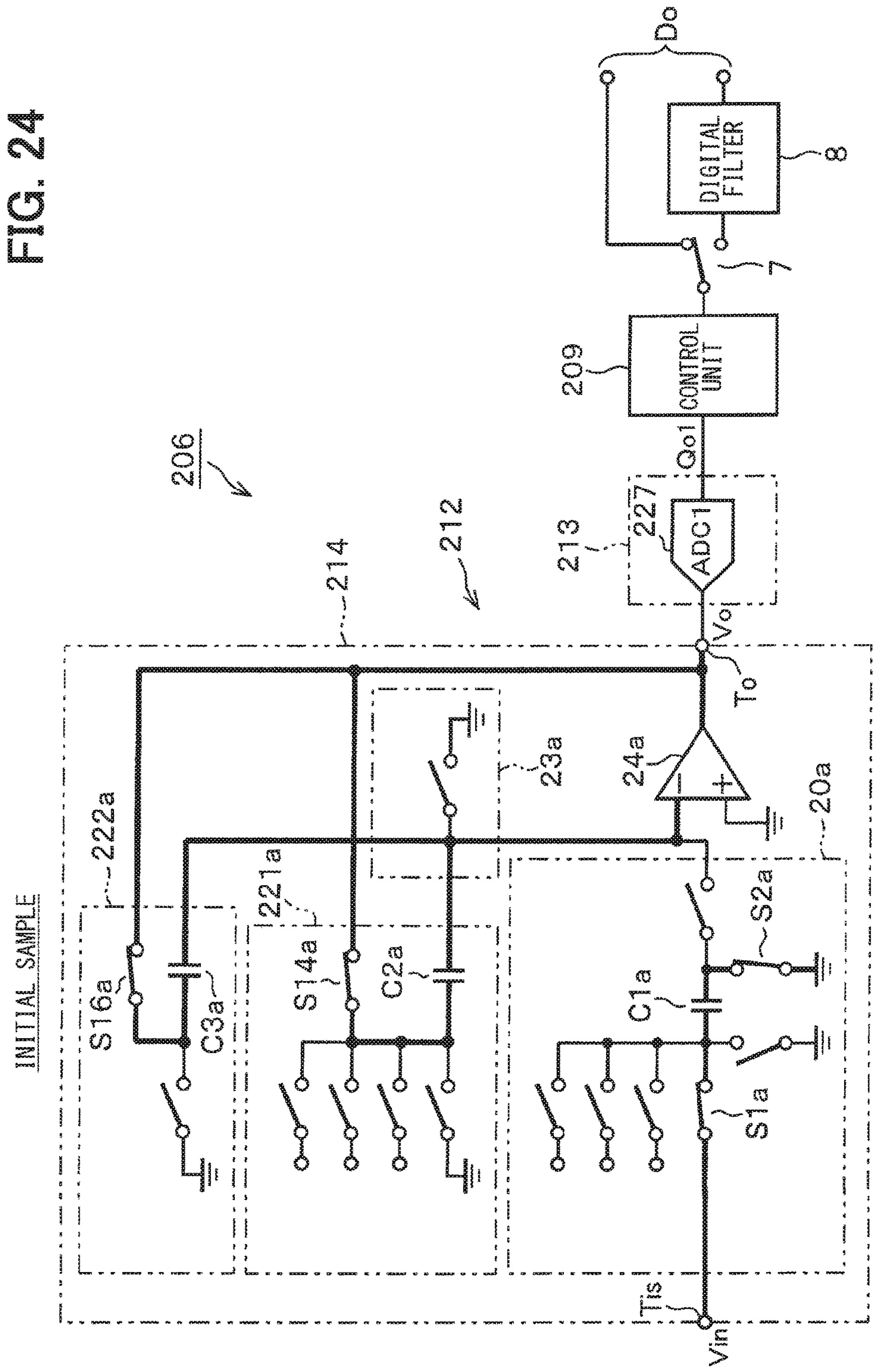
FIG. 24 is an illustrative view schematically illustrating one operation stage in the cyclic mode (No. 2)

As illustrated in FIG. 24, in the initial sample operation of the block 214, the control unit 209 turns on the switches S1*a*, S2*a*, S14*a*, and S16*a*, and turns off the other switches. The operation in this state is identical with the initial sample operation of the first block 114 in the second embodiment, and its description will be omitted.

(Initial Hold and Initial Cyclic Sample Operation)

Figure 25:
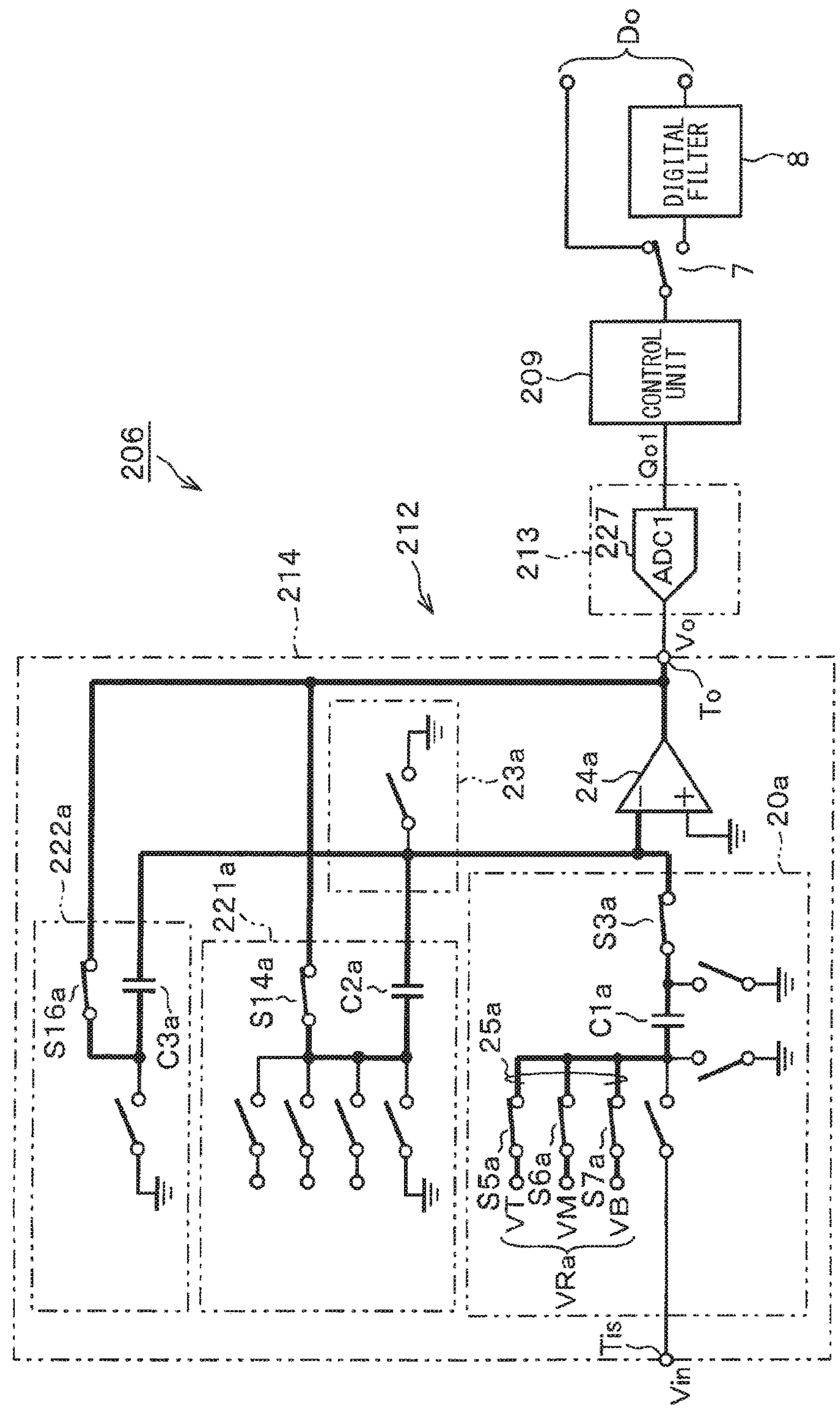
FIG. 25 is an illustrative view schematically illustrating one operation stage in the cyclic mode (No. 3)

As illustrated in FIG. 25, in the initial integration hold and the initial cyclic sample operation of the block 214, the control unit 209 turns on any one of the switches S5*a* to S7*a*, S14*a*, and S16*a*, and turns off the other switches. The control unit 209 turns on any one of the switches S5*a* to S7*a* of the D/A converter 25*a*, thereby to input the conversion output VRa of the D/A converter 25*a* to the other end of the capacitor C1*a*. In this state, the residual charge fed back after subtracting the charge corresponding to the conversion output VRa of the D/A converter 25*a* from the charge accumulated in the capacitor C1*a* during the initial sample operation of the block 214 described above migrates to the capacitors C2*a* and C3*a*. As a result, the residual charge is accumulated in the capacitors C2*a* and C3*a*. In this state, the output voltage Vo of the output terminal To becomes a1×Vin when it is assumed that the voltage gain of the block is a1.

(Cyclic Hold Operation)

Figure 26:
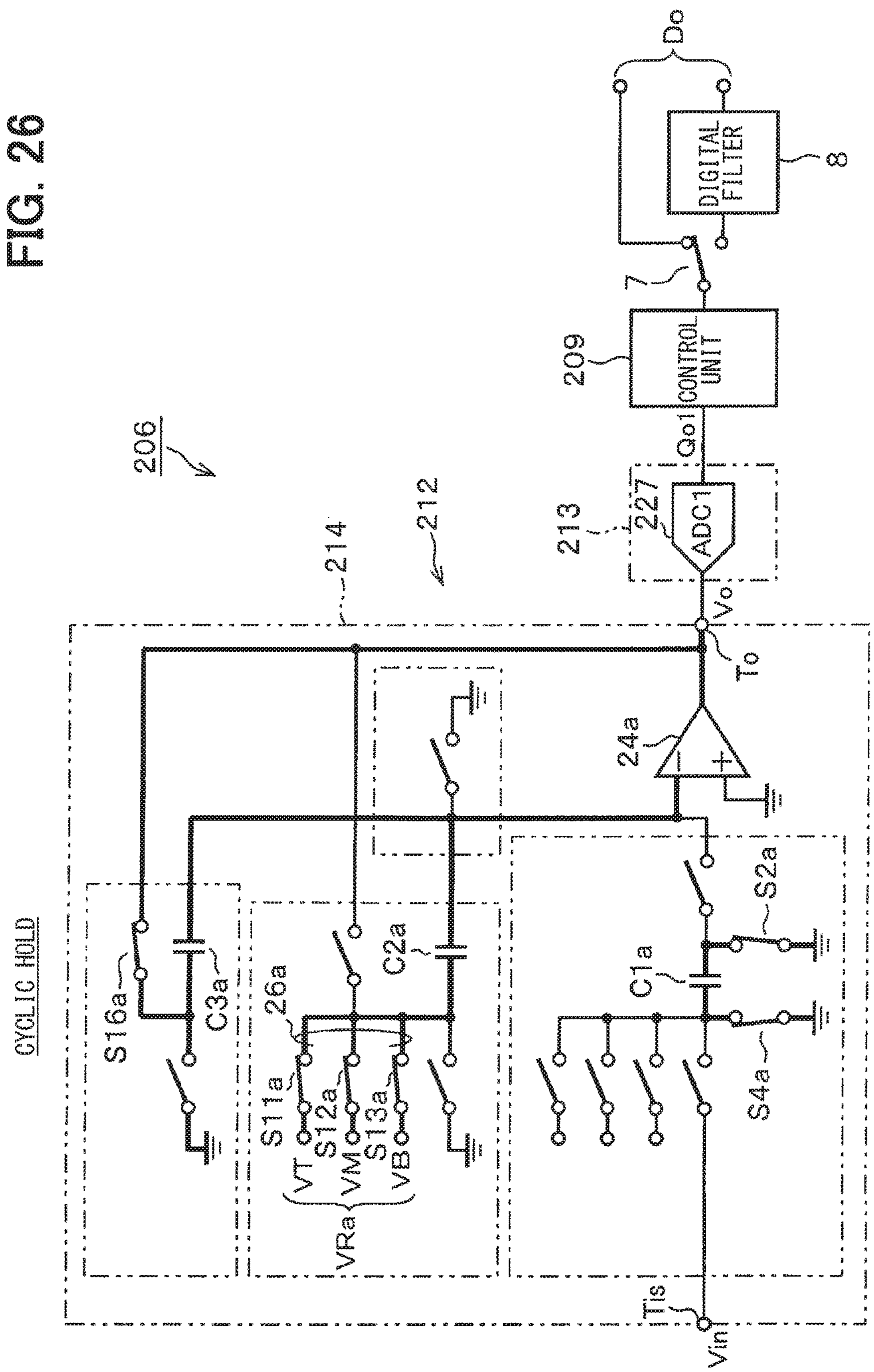
FIG. 26 is an illustrative view schematically illustrating one operation stage in the cyclic mode (No. 4)

As illustrated in FIG. 26, in the cyclic hold operation of the block 214, the control unit 209 turns on any one of the switches S11*a* to S13*a* of the D/A converter 26*a* according to the quantization value Qo1 of the quantization unit 213, turns on the switches S2*a*, S4*a*, and S16*a*, and turns off the other switches. The control unit 209 turns on any one of the switches S11*a* to S13*a* of the D/A converter 26*a*, thereby to input the conversion output VRa of the D/A converter 26*a* to the other end of the capacitor C2*a*. In this state, the multiplying-DAC processing in which the arithmetic amplifier 24*a* subtracts the electric charge corresponding to the conversion output VRa of the D/A converter 26*a* based on the digital output of the quantization unit 213 from the electric charge accumulated in the capacitors C1*a* and C3*a* during the operation shown in FIG. 25 described above and the residual charge is accumulated in the capacitor C3*a* is performed. In this state, the output voltage Vo becomes 2×a1×Vin−conversion output VRa, and the quantization unit 213 quantizes the output voltage Vo through the A/D converter 227, and outputs the quantized voltage. The control unit 209 turns on the switches S2*a* and S4*a* to connect both ends of the capacitor C1*a* to the analog ground line, and performs discharging.

(Cyclic Sample Operation)

Figure 27:
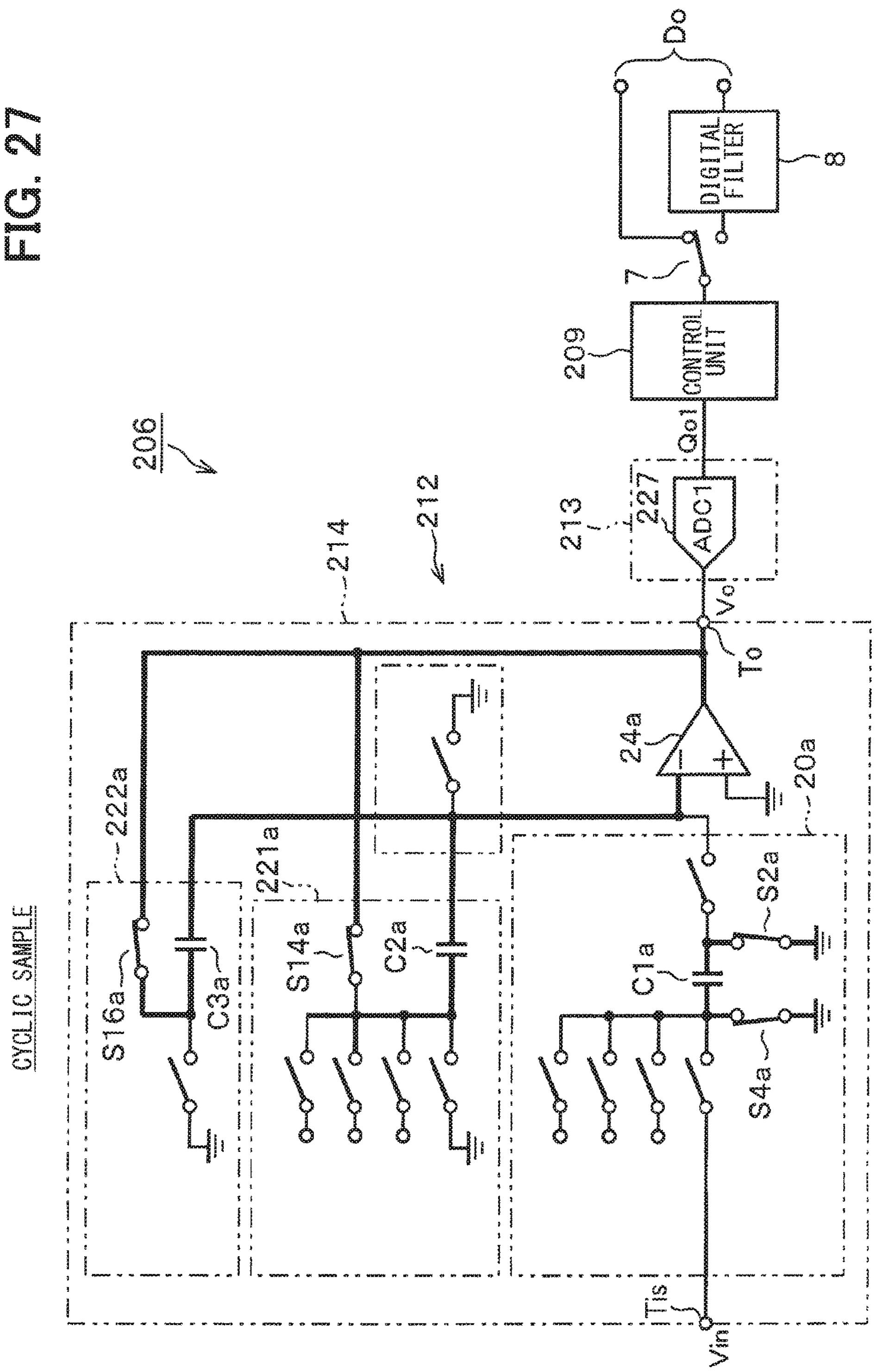
FIG. 27 is an illustrative view schematically illustrating one operation stage in the cyclic mode (No. 5).

As illustrated in FIG. 27, in the cyclic sample operation of the block 214, the control unit 209 turns on the switches S2*a*, S4*a*, S14*a*, and S16*a*, and turns off the other switches. As a result, the control unit 209 charges the capacitor C2*a* with the output voltage Vo. In this state, (the output voltage Vo=2×a1×Vin−conversion output VRa) described above is input to the capacitor C2*a*.

Thereafter, the control unit 209 controls the on/off operation of the switch described above to repeat (cyclic hold operation) and (cyclic sample operation), and outputs the quantized voltage while quantizing the higher bits to the lower bits by the A/D converter 227 of the quantization unit 213. With the above processing, the A/D converter can be completely operated in the cyclic mode.

(3) Hybrid Mode

The respective operating states when executing the hybrid mode will be described with reference to FIGS. 23 to 27. In the hybrid mode, the control unit 209 changes over the switch 7 so as to disconnect the A/D converter 227 of the quantization unit 213 from the digital filter 8. The block 214 first performs the reset operation illustrated in FIG. 23, and thereafter repetitively performs (the initial sample operation) illustrated in FIG. 24 and then (the initial hold operation and the initial cyclic sample operation) illustrated in FIG. 25 for a predetermined number of times.

In the hybrid mode, the operation of repeating (the initial sample operation) and (the initial hold operation and the initial cyclic sample operation) for multiple times is performed as the ΔΣ type A/D conversion processing. A value generated by subjecting the quantization value generated by the aid of the A/D conversion processing to a predetermined digital integration process with the use of the digital integrator is set as a value of the higher bits. In this state, the D/A converter 25*a* selects the switch S5*a*, S6*a*, or S7*a* corresponding to any one of the conversion outputs VT, VM, and VB according to the digital output of the A/D converter 227, and turns on the selected switch. Subsequently, the output voltage Vo of the residual bits is delivered to (the cyclic hold operation) and (the cyclic sample operation) which will be described. Thereafter, the one block 214 repetitively performs (the cyclic hold operation) illustrated in FIG. 26 and (the cyclic sample operation) illustrated in FIG. 27 by the number of residual bits.

In other words, the ΔΣ type A/D conversion processing is performed when the operation illustrated in FIGS. 24 and 25 is repeated for multiple times, and thereafter the cyclic type A/D conversion processing is performed when the operation illustrated in FIGS. 26 and 27 is repeated. With the above processing, the A/D converter can be operated in the hybrid mode.

The control unit 209 combines the value of the higher bits obtained as described above with the value of the lower bits obtained by repeating (the cyclic hold operation) and (cyclic sample operation) as occasion demands, and obtains the addition result as the data output Do. Similarly, in the above hybrid mode, the final data output Do can be acquired.

As disclosed in the present embodiment, even if the A/D conversion device 206 is of a primary configuration having one block 214, the A/D conversion device can operate in the respective modes of (1) the ΔΣ mode, (2) the cyclic mode, and (3) the hybrid mode. As described in the above embodiment, the A/D conversion device can be operated while setting the processing ratio of the ΔΣ type and the cyclic type, thereby obtaining the same advantages as those in the first embodiment.

According to the present embodiment, since the A/D conversion device 206 is provided with one block 214, as compared with the first and second embodiments, the circuit can be simplified, and the circuit scale can be reduced. In addition, the same advantages as those in the first and second embodiments are obtained.

Other Embodiments

The present disclosure is not limited to the embodiments described above, but can be implemented with various modifications, and can be applied to various embodiments without departing from the spirit of the present disclosure. For example, the modifications or expansions described below are enabled. The respective components are conceptual, and not limited to the above embodiments.

The detection contents of the voltage detection device 1 are not limited to the contents illustrated in the first embodiment. For example, the peripheral circuit 11 may be configured by, for example, a circuit that receives and detects the inter-terminal voltages of the respective battery cells 3 or the total voltage. In that event, the voltage detection device according to the present disclosure may be applied to a device where in preparation for a case in which a failure occurs in the assembled battery 2, the peripheral circuit 11 is provided with a function for outputting a reference voltage based on the inter-terminal voltage of the assembled battery 2, and it is determined that no failure occurs on the condition that the reference voltage falls within a specific range. In this case, the multiplexer 5 receives the reference voltage when employing this determination method, and outputs the reference voltage to the A/D conversion device 6. The same inter-terminal voltage across the battery cells 3 is input to the multiple multiplexers 4 and 5, and the outputs of those multiplexers 4 and 5 are compared with each other. With the above configuration, the present disclosure may be applied to the device for detecting whether a failure is present in the multiplexers 4 and 5, or not.

In the above configuration, when the A/D conversion device 6, 106, or 206 subjects one or more inter-terminal signals of the battery cells 3 as the analog input signal Vin to the A/D conversion, the A/D conversion device performs the A/D conversion processing with the A/D conversion processing ratio of the ΔΣ type and the cyclic type as the predetermined first ratio. When the A/D conversion device subjects the failure diagnosis signal as the analog input signal Vin to the A/D conversion during the failure diagnosis, the A/D conversion device performs the A/D conversion processing with the second ratio less than the first ratio in the ratio of the ΔΣ type A/D conversion processing.

However, the present disclosure is not limited to the above configuration, and the ratio of the first ratio and the second ratio may be inverted between the monitoring purpose and the failure monitoring purpose of the inter-terminal signals of the battery cells 3. The above cases may be applied to a configuration in which the A/D conversion processing is performed at the identical or different ratio in the hybrid mode. For that reason, the conversion accuracy and the processing time of the A/D conversion devices 6, 106, and 206 can be flexibly changed according to the monitoring purpose.

The conversion outputs VRa and VRb of the quantization unit 13 are not limited to three levels, but may be appropriately set according to the number of levels of the quantization value in the quantization unit 13. According to the above number of levels, the conversion output VRa of the first D/A converters 25*a* and 26*a* in the first capacitor switching circuits 20*a*, 21*a*, and 22*a*, and the conversion output VRb of the second D/A converters 25*b* and 26*b* in the second capacitor switching circuits 20*b*, 21*b*, and 22*b* may be changed in the number of levels.

In the above embodiments, the quantization unit 13 includes the A/D converters 27*a* and 27*b* for each of the blocks 14 and 15, individually. However, as disclosed in the above embodiments, because the output voltages Vo1 and Vo1 of both the blocks 14 and 15 may not be quantized at the same time, the quantization unit 13 may be configured by a selector circuit that can select any one of the output voltages Vo1 and Vo1, and a single A/D converter that subjects the output selected by the selector circuit to the A/D conversion.

In the first and second embodiments, the signal processing unit 12, 112 is configured by the ΔΣ modulator including the blocks 14, 15, 114, 115, and the quantization unit 13. However, the type of the ΔΣ modulator is not limited to the above configuration. For example, the ΔΣ modulator may be configured to operate as a secondary cascade of integrators with feedforward (CIFF) type ΔΣ modulator which is a typical example of the feedforward type ΔΣ modulator.

In the above embodiments, the first block 14, 114, the second block 15, 115, and the block 214 are each configured by a single-end type circuit that inputs the signal to the inverting input terminals that are one inputs of the arithmetic amplifiers 24*a* and 25*a*, and connects the non-inverting input terminals that are the other inputs to the analog ground line. Alternatively, those blocks may be configured by a differential type that inputs a differential signal to a fully differential or pseudo-differential arithmetic amplifier.

For example, functions of a single component may be distributed to multiple components, or functions of multiple components may be integrated in a single component. In addition, at least a part of the above-described embodiments may be switched to a known configuration having the same functions. In addition, a part or all of the configurations of the two or more embodiments described above may be combined together, or replaced with each other.

The voltage detection device described above detects the voltages across the multiple battery cells configuring the assembled battery. The voltage detection device is provided with the A/D conversion device and the control unit. The A/D conversion device acquires the inter-terminal signals of one or more battery cells in the multiple battery cells when detecting the voltages across the battery cells, or the failure diagnosis signal during the failure diagnosis, and subjects the acquired signal to the A/D conversion. The A/D conversion device includes the ΔΣ mode for performing the A/D conversion processing as the ΔΣ type, the cyclic mode for performing the A/D conversion processing as the cyclic type, and the hybrid mode for subjecting the remaining bits to the A/D conversion processing as the cyclic type after subjecting the higher bits to the ΔΣ type A/D conversion processing.

When detecting the inter-terminal signals of the battery cell, the control unit allows the A/D conversion device to perform the A/D conversion processing in the ΔΣ mode or the hybrid mode, and when detecting the failure diagnosis signal during the failure diagnosis, the control unit allows the A/D conversion device to perform the A/D conversion processing in the cyclic mode or in the hybrid mode. In the ΔΣ mode, the cyclic mode, and the hybrid mode, it is confirmed that the detection accuracy and the processing time of the A/D conversion device are different from each other. For that reason, the detection accuracy and the processing time of the A/D conversion device can be flexibly changed according to a change in an object to be detected.

What is claimed is:

1. A voltage detection device for detecting a voltage across a plurality of battery cells forming an assembled battery, the voltage detection device comprising:

an A/D conversion device configured to acquire an inter-terminal signal of one or more battery cells in the plurality of battery cells, when detecting a voltage across the battery cells, and to acquire a failure diagnosis signal during a failure diagnosis, wherein the A/D conversion device is configured to subject the inter-terminal signal and the failure diagnosis signal as acquired to an A/D conversion, wherein the A/D conversion device is configured to perform ΔΣ type A/D conversion processing in a ΔΣ mode, to perform cyclic type A/D conversion processing in a cyclic mode, and to perform, in a hybrid mode, the cyclic type A/D conversion processing when acquiring remaining bits of higher bits after subjecting the higher bits to the ΔΣ type A/D conversion processing; and a control unit configured to control the A/D conversion device to switch the ΔΣ mode, the cyclic mode, and the hybrid mode, wherein the control unit is configured to cause the A/D conversion device to perform the A/D conversion processing in the ΔΣ mode or in the hybrid mode, when detecting the inter-terminal signal of the battery cells, and the control unit is configured to cause the A/D conversion device to perform the A/D conversion processing in the cyclic mode or in the hybrid mode, when detecting the failure diagnosis signal during the failure diagnosis.

2. The voltage detection device according to claim 1, wherein the control unit is configured to cause the A/D conversion device to perform the A/D conversion processing at a predetermined first ratio of the ΔΣ type processing to the cyclic type processing when the A/D conversion device performs the A/D conversion on the inter-terminal signal of the battery cells as an analog input signal, and the control unit is configured to cause the A/D conversion device to perform the A/D conversion processing at a second ratio less in the ΔΣ mode processing ratio than the first ratio when the A/D conversion device performs the A/D conversion on the failure diagnosis signal as the analog input signal during the failure diagnosis.

3. The voltage detection device according to claim 1, wherein the A/D conversion device includes:

a quantization unit that has an A/D converter, a first block; and a second block, wherein the first block includes a first capacitor switching circuit that has a first D/A converter, wherein the first capacitor switching circuit is configured to charge and discharge an accumulated charge in a first capacitor depending on an output of the first D/A converter according to a switching operation of a switch by the control unit and a first arithmetic amplifier configured to perform processing corresponding to the accumulated charge in the first capacitor of the first capacitor switching circuit and to receive the analog input signal, the second block includes a second capacitor switching circuit that has a second D/A converter, wherein the second capacitor switching circuit is configured to charge and discharge an accumulated charge in a second capacitor according to the switching operation of the switch by the control unit and a second arithmetic amplifier configured to perform processing corresponding to the accumulated charge in the second capacitor of the second capacitor switching circuit and to receive an output voltage of the first arithmetic amplifier in the first block, wherein the first block and the second block form a two-stage configuration to conduct a digital output of the A/D converter to the first capacitor and/or the second capacitor through the first D/A converter and/or the second D/A converter according to the switching operation of the switch by the control unit, and to integrate the digital output by the first arithmetic amplifier and/or the second arithmetic amplifier.

4. The voltage detection device according to claim 1, wherein the A/D conversion device includes:

a capacitor switching circuit that has a capacitor and a D/A converter, wherein the capacitor switching circuit is configured to charge and discharge an accumulated charge in the capacitor according to a switching operation of a switch by the control unit;

an arithmetic amplifier configured to perform processing corresponding to the accumulated charge in the capacitor of the capacitor switching circuit; and a quantization unit that has an A/D converter configured to perform the A/D conversion processing on an output voltage processed by the arithmetic amplifier, wherein a block forms a one-stage configuration to conduct a digital output of the A/D converter to the capacitor through the D/A converter and to integrate the digital output by the arithmetic amplifier.

5. The voltage detection device according to claim 3, wherein the A/D conversion device is configured to perform the A/D conversion processing in each of the ΔΣ mode, the cyclic mode, and the hybrid mode by using the same arithmetic amplifier.

6. The voltage detection device according to claim 3, wherein the A/D conversion device further includes a digital filter configured to subject an A/D conversion result by the A/D converter to digital filter processing, and the control unit is configured to output data through the digital filter when causing the A/D conversion device to perform the A/D conversion processing in the ΔΣ mode.

7. The voltage detection device according to claim 1, wherein the A/D conversion device includes a quantization unit including an A/D converter, the control unit is configured, when the control unit operates the A/D conversion device in the cyclic mode, to cause a first capacitor in a first capacitor switching circuit to input and sample an analog input signal, to cause the A/D converter to input the analog input signal, to conduct a digital output from the A/D converter to the first capacitor through a first D/A converter, to cause the first arithmetic amplifier to perform a multiplying-DAC operation, to cause a second capacitor of a second capacitor switching circuit to sample an output voltage from the first arithmetic amplifier, to set a digital output obtained by inputting the output voltage from the first arithmetic amplifier to the A/D converter as higher bits, to conduct the digital output obtained by the A/D converter to the second capacitor through the second D/A converter, to cause a second arithmetic amplifier to perform the multiplying-DAC operation, to cause the first capacitor to cyclically sample the output voltage from the second arithmetic amplifier, to set a digital output obtained by inputting the output voltage from the second arithmetic amplifier to the A/D converter as lower bits of the higher bits, and to repeat a process of acquiring the higher bits and the lower bits from a most significant bit to a least significant bit.

8. The voltage detection device according to claim 1, wherein the A/D conversion device includes a quantization unit including an A/D converter, the control unit is configured, when operating the A/D conversion device in the cyclic mode, to perform a first operation of causing the capacitor of the capacitor switching circuit for an analog signal input to initially sample the analog input signal, to perform a second operation of supplying a predetermined intermediate fixed value to the capacitor of the capacitor switching circuit for the analog signal input through the DI/A converter, integrating the intermediate fixed value by the first arithmetic amplifier, and initially holding an output voltage of the first arithmetic amplifier, to perform a third operation of causing the capacitor in the capacitor switching circuit for a signal input to initially sample the output voltage of the first arithmetic amplifier, and to perform a fourth operation of supplying the intermediate fixed value to the capacitor of the capacitor switching circuit for the signal input through the D/A converter, integrating the supplied intermediate fixed value by the second arithmetic amplifier, and initially holding the output voltage of the second arithmetic amplifier, wherein the control unit is configured, after repeating the first to fourth operations for a plurality of times, to discharge the accumulated charge in the capacitor of the first capacitor switching circuit, thereafter to conduct the digital output, which is obtained by inputting the output voltage of the second arithmetic amplifier to the A/D converter, to the capacitor of the capacitor switching circuit through the D/A converter, to cause the first arithmetic amplifier to perform the multiplying-DAC operation, to cause the capacitor of the second capacitor switching circuit to cyclically sample the output voltage of the first arithmetic amplifier, to acquire the digital output obtained by inputting the output voltage of the arithmetic amplifier to the A/D converter as the higher bits, to conduct the digital output obtained by the A/D converter to the capacitor of the capacitor switching circuit through the D/A converter, to cause the second arithmetic amplifier to perform the MDAC operation, and to cause the capacitor of the first capacitor switching circuit to cyclically sample the output voltage of the second arithmetic amplifier, and further to acquire the digital output obtained by inputting the output voltage of the second arithmetic amplifier to the A/D converter as lower bits of the higher bits, and the control unit is configured to repeat a process of acquiring the higher bits and the lower bits from a most significant bit to a least significant bit.

* * * * *